United States Patent
Sharma et al.

(10) Patent No.: US 10,355,047 B1
(45) Date of Patent: Jul. 16, 2019

(54) FABRICATION METHODS OF FORMING ANNULAR VERTICAL SI ETCHED CHANNEL MOS DEVICES

(71) Applicant: Spin Memory, Inc.

(72) Inventors: Gian Sharma, Fremont, CA (US); Amitay Levi, Cupertino, CA (US); Andrew J. Walker, Mountain View, CA (US); Kuk-Hwan Kim, San Jose, CA (US); Dafna Beery, Palo Alto, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,222

(22) Filed: Dec. 29, 2017

(51) Int. Cl.
*H01L 27/22* (2006.01)
*H01L 43/02* (2006.01)
*H01L 29/66* (2006.01)
*H01L 43/12* (2006.01)
*H01L 29/78* (2006.01)
*H01L 43/08* (2006.01)

(52) U.S. Cl.
CPC ...... *H01L 27/228* (2013.01); *H01L 29/66666* (2013.01); *H01L 29/7827* (2013.01); *H01L 43/02* (2013.01); *H01L 43/08* (2013.01); *H01L 43/12* (2013.01)

(58) Field of Classification Search
CPC ............. H01L 27/228; H01L 29/66666; H01L 29/7527
See application file for complete search history.

(56) References Cited

U.S. PATENT DOCUMENTS

| 2012/0012913 A1* | 1/2012 | Lee ................... H01L 27/10852 257/302 |
| 2012/0052640 A1* | 3/2012 | Fischer ........... H01L 21/823425 438/268 |
| 2012/0086066 A1* | 4/2012 | Kim ..................... H01L 27/108 257/306 |

(Continued)

OTHER PUBLICATIONS

Restriction Requirement from U.S. Appl. No. 15/859,245, dated Dec. 20, 2018.
Sharma et al., U.S. Appl. No. 15/859,245, filed Dec. 29, 2017.

*Primary Examiner* — Errol V Fernandes
(74) *Attorney, Agent, or Firm* — Zilka-Kotab, P.C.

(57) ABSTRACT

A method, according to one embodiment, includes: forming an annular cylindrical channel from a single block of electrically conductive material; forming an oxide layer over exposed surfaces of the annular cylindrical channel and exposed surfaces of the block of electrically conductive material; removing a portion of the oxide layer from an exterior base of the annular cylindrical channel, thereby forming a source contact recess which surrounds the base of the annular cylindrical channel; ion-implanting the exposed electrically conductive material substrate at a base of the source contact recess; and depositing a silicide material in the source contact recess, thereby forming a source contact tab. Moreover, other systems and methods are also described in additional embodiments herein which provide various different improved processes of forming the annular cylindrical channels, the source contact tabs, and/or the cylindrical pillar gate contacts for vertical transistor structures in comparison to conventional surface transistor structures.

6 Claims, 17 Drawing Sheets

(56) References Cited

U.S. PATENT DOCUMENTS

| | | | | |
|---|---|---|---|---|
| 2015/0279933 A1* | 10/2015 | Xiao | ................... | H01L 21/2252 |
| | | | | 257/400 |
| 2018/0040740 A1* | 2/2018 | Cantoro | .......... | H01L 21/823807 |
| 2018/0151357 A1* | 5/2018 | More | ................ | H01L 29/66227 |

* cited by examiner

FABRICATION METHODS OF FORMING ANNULAR VERTICAL SI ETCHED CHANNEL MOS DEVICES

FIELD OF THE INVENTION

The present invention relates to magnetoresistive random-access memory (MRAM), and more particularly, this invention relates to increasing the effective storage density of MRAM, as well as enhancing the operational range of performance, ease, speed, capabilities, etc., of MRAM devices and also various other switching and storage devices.

BACKGROUND

MRAM is a non-volatile memory technology that stores data through magnetic storage elements. Because MRAM is non-volatile, memory written thereto may be retained even when the power supply of the MRAM is turned off. The magnetic storage elements used to actually store the data include two ferromagnetic plates, or electrodes, that can hold a magnetic field and are separated by a non-magnetic material, such as a non-magnetic metal or insulator. In general, one of the plates is referred to as the reference layer and has a magnetization which is pinned. In other words, the reference layer has a higher coercivity than the other plate and requires a larger magnetic field or spin-polarized current to change the orientation of its magnetization. The second plate is typically referred to as the free layer whose magnetization direction which can be changed by relatively smaller magnetic fields or a spin-polarized current relative to the reference layer.

MRAM devices store information by storing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a memory element changes due to the orientation of the magnetic fields of the two layers. The resistance of a cell will be different for the parallel and anti-parallel states and thus the cell's resistance can be used to distinguish between a logical "1" and a logical "0".

An important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density. Moreover, other types of random access memory are unable to achieve a storage density which rivals that of MRAM. For example, looking to FIGS. 1A-1B, a conventional transistor dynamic random access memory (DRAM) cell 100 is shown. Various components included in the DRAM cell are called out in FIGS. 1A-1B as would be appreciated by one skilled in the art.

SUMMARY

A method of forming a cylindrical vertical transistor; the method, according to one embodiment, includes: forming an annular cylindrical channel from a single block of electrically conductive material; forming an oxide layer over exposed surfaces of the annular cylindrical channel and exposed surfaces of the block of electrically conductive material; removing a portion of the oxide layer from an exterior base of the annular cylindrical channel, thereby forming a source contact recess which surrounds the base of the annular cylindrical channel; ion-implanting the exposed electrically conductive material substrate at a base of the source contact recess; and depositing a silicide material in the source contact recess, thereby forming a source contact tab.

Other aspects and advantages of the present invention will become apparent from the following detailed description, which, when taken in conjunction with the drawings, illustrate by way of example the principles of the invention.

DETAILED DESCRIPTION

Figure 1:
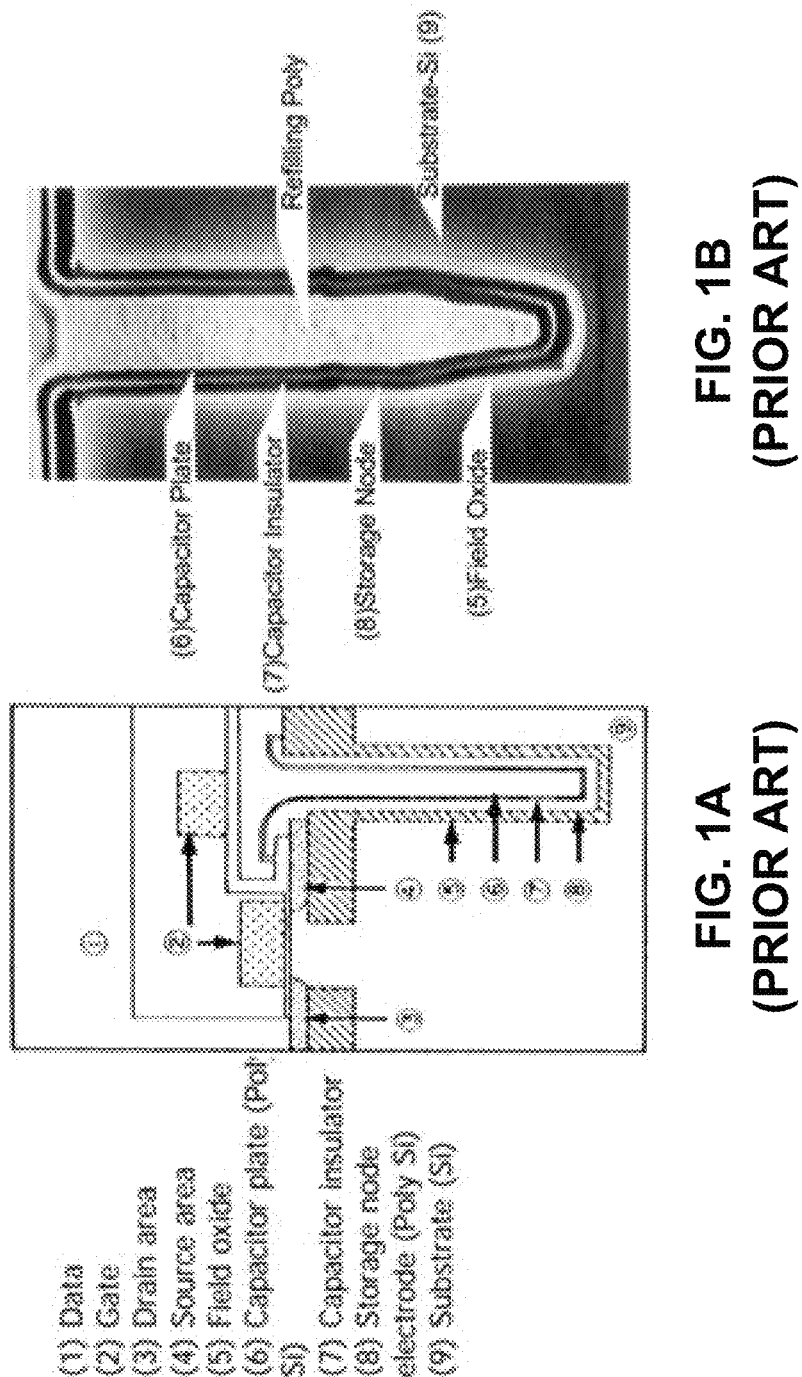
FIGS. 1A-1B are representational views of one transistor DRAM cell according to the prior art.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of MRAM having improved data storage density and capabilities and/or related systems and methods.

In one general embodiment, a method of forming a cylindrical vertical transistor includes: forming an annular cylindrical channel from a single block of electrically conductive material; forming an oxide layer over exposed surfaces of the annular cylindrical channel and exposed surfaces of the block of electrically conductive material; removing a portion of the oxide layer from an exterior base of the annular cylindrical channel, thereby forming a source contact recess which surrounds the base of the annular cylindrical channel; ion-implanting the exposed electrically conductive material substrate at a base of the source contact recess; and depositing a silicide material in the source contact recess, thereby forming a source contact tab.

As previously mentioned, MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

Spin transfer torque or spin transfer switching, uses spin-aligned (polarized) electrons to change the magnetization orientation of the free layer in the magnetic tunnel junction (MTJ). In general, electrons possess a spin, which is a quantized amount of angular momentum intrinsic to the electron. An electrical current is generally not polarized, in that it generally includes of 50% spin up and 50% spin down electrons. However, passing a current though a magnetic layer polarizes electrons in the current with the spin orientation corresponding to the magnetization direction of the magnetic layer. Thus, the magnetic layer acts as a polarizer and produces a spin-polarized current as a result. Moreover, if a spin-polarized current is passed to the magnetic region of a free layer in the MTJ device, the electrons will transfer a portion of their spin-angular momentum to the target magnetization layer to produce a torque on the magnetization of the target free layer. Thus, this spin transfer torque can switch the magnetization of the free layer, thereby effectively writing either a logical "1" or a logical "0" based on whether the free layer is in the parallel or anti-parallel states relative to the reference layer.

Figure 2:
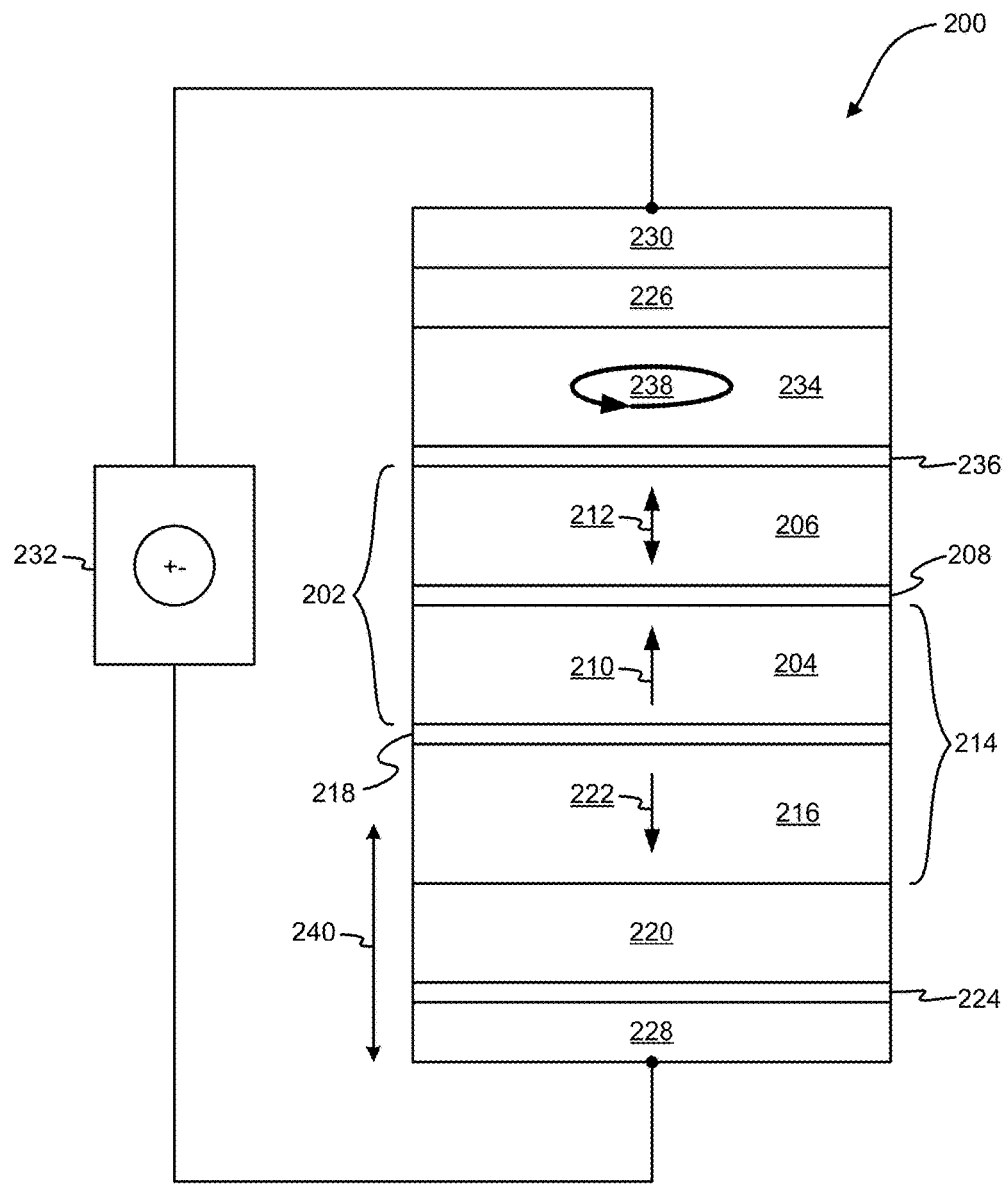
FIG. 2 is a representational view of a sensor stack for a MRAM memory element according to one embodiment.

Referring to FIG. 2, an illustrative sensor stack for a MTJ memory element 200 is shown according to one embodiment. The MTJ memory element 200 may be used in a p-MTJ memory element, as described in various embodiments herein. The MTJ memory element 200 may include a MTJ 202 that may include a magnetic reference layer 204, a magnetic free layer 206, and a thin, non-magnetic, electrically-insulating magnetic tunnel barrier layer 208 positioned between the reference layer 204 and the free layer 206 in a layer thickness direction 240. The tunnel barrier layer 208 may include an oxide, such as MgO, $Al_2O_3$, etc., or some other suitable material known in the art. The reference layer 204 has a magnetization 210 that is fixed in a direction that is perpendicular to a horizontal plane of the layer, as indicated by the arrow. The horizontal plane is sometimes referred to as a plane of formation in the embodiments described herein. The free layer 206 has a magnetization 212 that may be in either of two directions perpendicular to a horizontal plane of the free layer 206, as indicated by the two arrows. While the magnetization 212 of the free layer 206 remains in either of two directions perpendicular to the plane of the free layer 206 in a quiescent state, it may be selectable switched between these two directions, as is described in greater detail herein. When the magnetization 212 of the free layer 206 is in the same direction as the magnetization 210 of the reference layer 204, the electrical resistance across the MTJ 202 is at a low resistance state. Conversely, when the magnetization 212 of the free layer 206 is opposite to the magnetization 210 of the reference layer 204, the electrical resistance across the MTJ 202 is in a high resistance state.

The reference layer 204 may be part of an anti-parallel magnetic pinning structure 214 that may include a magnetic keeper layer 216 and a non-magnetic, antiparallel coupling layer 218 positioned between the keeper layer 216 and the reference layer 204 in the thickness direction 240. The antiparallel coupling layer 218 may include any suitable material known in the art, such as Ru, and may be constructed to have a thickness that causes ferromagnetic antiparallel coupling of the keeper layer 216 and the reference layer 204.

In one approach, the keeper layer 216 may be exchange coupled with an antiferromagnetic layer 220, which may include any suitable material known in the art, such as IrMn. Exchange coupling between the antiferromagnetic layer 220 and the keeper layer 216 strongly pins the magnetization 222 of the keeper layer 216 in a first direction. The antiparallel coupling between the keeper layer 216 and the reference layer 204 pins the magnetization 210 of the reference layer 204 in a second direction opposite to the direction of magnetization 222 of the keeper layer 216.

According to one approach, a seed layer 224 may be positioned below the keeper layer 216 in the thickness direction 240 to initiate a desired crystalline structure in the layers deposited thereabove.

In another approach, a capping layer 226 may be positioned above the free layer 206 to protect the underlying layers during manufacture, such as during high temperature annealing.

A lower electrode 228 and an upper electrode 230 may be positioned near a bottom and a top of the MTJ memory element 200, respectively, in one approach. The lower electrode 228 and the upper electrode 230 may be constructed of a non-magnetic, electrically conductive material of a type known in the art, such as Au, Ag, Cu, etc., and may provide an electrical connection with a circuit 232. The circuit 232 may include a current source, and may further include circuitry for reading an electrical resistance across the MTJ memory element 200.

The magnetic free layer 206 has a magnetic anisotropy that causes the magnetization 212 of the free layer 206 to remain stable in one of two directions perpendicular to the horizontal plane of the free layer 206. In a write mode of use for the MTJ memory element 200, the orientation of the magnetization 212 of the free layer 206 may be switched between these two directions by applying an electrical current through the MTJ memory element 200 via the circuit 232. A current in a first direction causes the magnetization 212 of the free layer 206 of the MTJ memory element 200 to flip to a first orientation, and a current in a second direction opposite to the first direction causes the magnetization 212 of the free layer 206 of the MTJ memory element 200 to flip to a second, opposite direction.

For example, if the magnetization 212 is initially oriented in an upward direction in FIG. 2, applying a current in a downward direction through the MTJ memory element 200 cause electrons to flow in an opposite direction upward through the MTJ memory element 200. Electrons travelling through the reference layer 204 become spin polarized as a result of the magnetization 210 of the reference layer 204. These spin-polarized electrons cause a spin torque on the magnetization 212 of the free layer 206, which causes the magnetization 212 to flip directions, from the upward direction to a downward direction.

On the other hand, if the magnetization 212 of the free layer 206 is initially in a downward direction in FIG. 2, applying an electrical current through the MTJ memory element 200 in an upward direction in FIG. 2 causes electrons to flow in an opposite direction, downward through the MTJ memory element 200. However, because the magnetization 212 of the free layer 206 is opposite to the magnetization 210 of the reference layer 204, the electrons will not be able to pass through the tunnel barrier layer 208. As a result, the electrons (which have been spin polarized by the magnetization 212 of the free layer 206) will accumulate at the junction between the free layer 206 and the tunnel barrier layer 208. This accumulation of spin polarized electrons causes a spin torque that causes the magnetization 212 of the free layer 206 to flip from the downward direction to an upward direction.

In order to assist the switching of the magnetization 212 of the free layer 206, the MTJ memory element 200 may include a spin polarization layer 234 positioned above the free layer 206. The spin polarization layer 234 may be separated from the free layer 206 by an exchange coupling layer 236. The spin polarization layer 234 has a magnetic anisotropy that causes it to have a magnetization 238 with a primary component oriented in the in plane direction (e.g., perpendicular to the magnetization 212 of the free layer and the magnetization 210 of the reference layer 204). The magnetization 238 of the spin polarization layer 234 may be fixed in one approach, or may move in a processional manner as shown in FIG. 2. The magnetization 238 of the spin polarization layer 234 causes a spin torque on the free layer 206 that assists in moving its magnetization 212 away from its quiescent state perpendicular to the plane of the free layer 206. This allows the magnetization 212 of the free layer 206 to more easily flip with less energy being utilized to flip the magnetization 212 in response to applying a write current to the MTJ memory element 200.

The MTJ memory element 200 described in FIG. 2 is intended to provide context to the various embodiments described herein. The structures and methods described herein in accordance with various embodiments may include a portion of the MTJ memory element 200 described in FIG. 2 and/or used in conjunction with the MTJ memory element 200, in various approaches.

It should be noted that the MTJ sensor stack configuration illustrated in FIG. 2 is in no way intended to limit the invention. Rather, the sensor stack included in MTJ memory element 200 of FIG. 2 is presented by way of example only. Accordingly, any of the embodiments described herein which include reference to a MTJ structure (e.g., sensor stack) may implement a MTJ sensor structure similar to or the same as that shown in FIG. 2, or any other MTJ sensor structure which would be apparent to one skilled in the art after reading the present description.

A MTJ sensor stack, e.g., such as that illustrated in FIG. 2, may be electrically coupled with a transistor in order to write information to the MTJ sensor stack such that the information is stored in the sensor stack itself. As previously mentioned, information may be written (or overwritten) to a MTJ sensor stack by causing the magnetic orientation of the free layer to flip. Moreover, flipping the magnetic orientation of the free layer may be achieved by selectively passing a current through the sensor stack, e.g., as will be described in further detail below.

Figure 3:
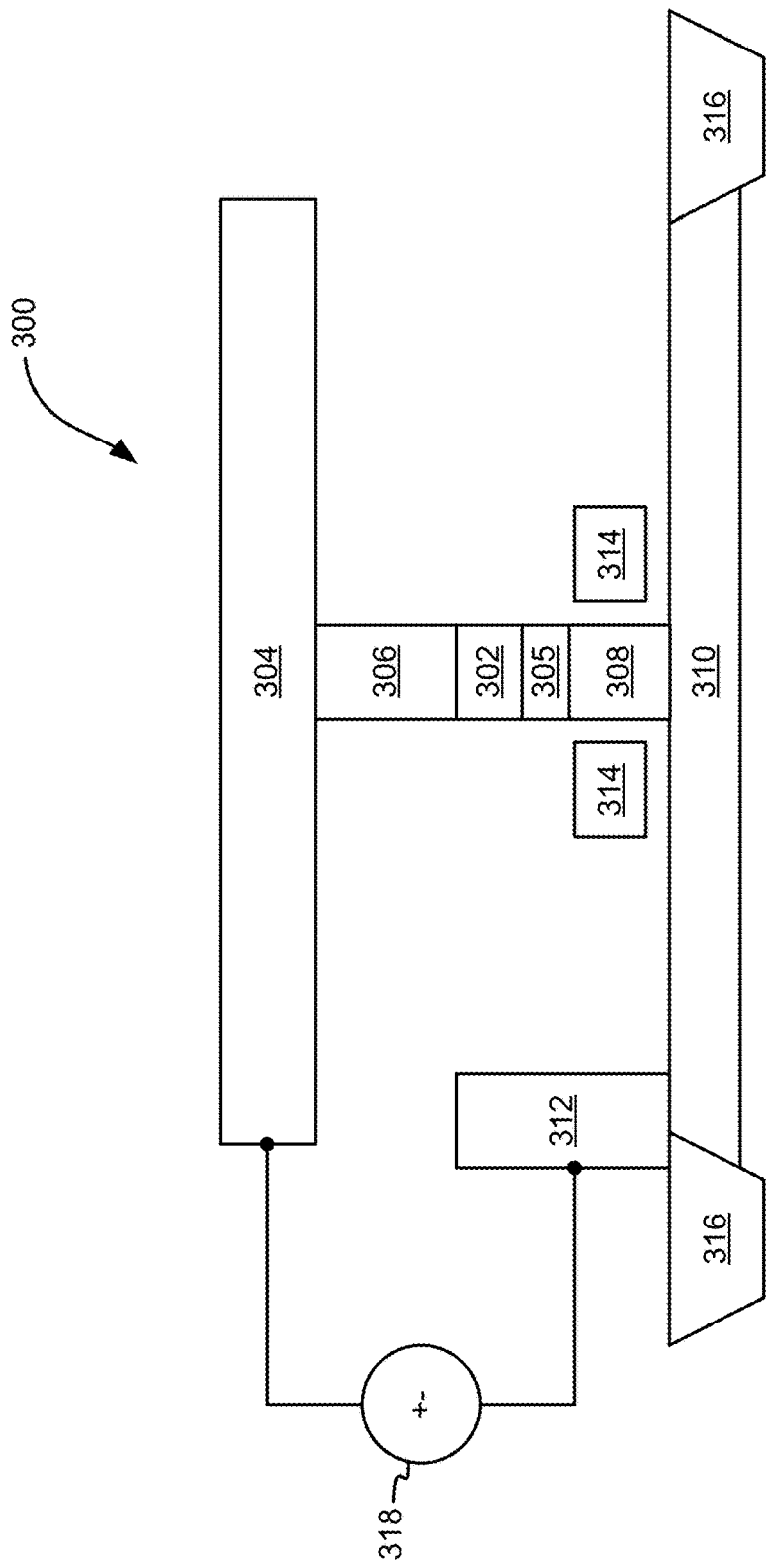
FIG. 3 is a schematic view of a perpendicular magnetic tunnel junction cell according to one embodiment.

Looking now to FIG. 3, a portion of a MRAM cell 300 that includes a magnetoresistive sensor stack 302 is shown according to one embodiment. The MRAM cell 300 may be operated and utilized as understood by those of skill in the art, with any special use cases being specified in accordance with an embodiment herein. The memory element 200 described in FIG. 2 may be used as the magnetoresistive sensor stack 302 of FIG. 3 in accordance with embodiments that store data in MRAM. In one embodiment, an MTJ element may be used as the magnetoresistive sensor stack 302.

The MRAM cell 300 also includes a bit line 304 that supplies current across the magnetoresistive sensor stack 302 from a current source 318. The bit line 304 may include any suitable material known in the art, such as TaN, W, TiN, Au, Ag, Cu, etc. An extension layer 306 electrically connects the magnetoresistive sensor stack 302 with the bit line 304. The extension layer 306 may include any suitable material known in the art, such as Ru, Ta, etc. A source line 305 is coupled between the magnetoresistive sensor stack 302 and a channel layer 308, the channel layer 308 further being in electrical contact with an n+ source layer 310. The channel layer 308 may include any suitable semiconductor material known in the art, such as Si, Ge, GaAs-compounds, etc. The n+ source layer 310 may include any suitable material known in the art, such as TaN, W, TiN, Au, Ag, Cu, etc., and is electrically connected to the current source 318 via a source line 312, which may include any suitable material known in the art, such as TaN, W, TiN, Au, Ag, Cu, etc. Positioned across the channel layer 308 is a word line 314 which may include any suitable material known in the art, such as TaN, W, TiN, Au, Ag, Cu, etc. On either side of the n+ source layer 310 are shallow trench isolation (STI) layers 316 which provide electrical insulation of the n+ source layer 310. Moreover, although not specifically shown, electrically insulative material may be positioned around the various layers shown in FIG. 3, as would be understood by one of skill in the art.

As previously mentioned, an important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density. For instance, in semiconductor manufacturing processes, mostly planar metal oxide semiconductor (MOS) metal gate technologies are used. However, this technology offers a limited amount of achievable transistor drive current depending on the photo-lithographically defined gate width, gate length and/or other materials properties. Moreover, other types of random access memory are unable to achieve a storage density which rivals that of MRAM.

In sharp contrast, various ones of the approaches included herein are able to successfully improve the drive currents for the MRAM devices. This significant improvement to drive currents in MRAM devices may be achieved by flowing the operating current for MRAM cells in the vertical direction while using the same photolithography capability, e.g., as will be described in further detail below.

Figure 4A:
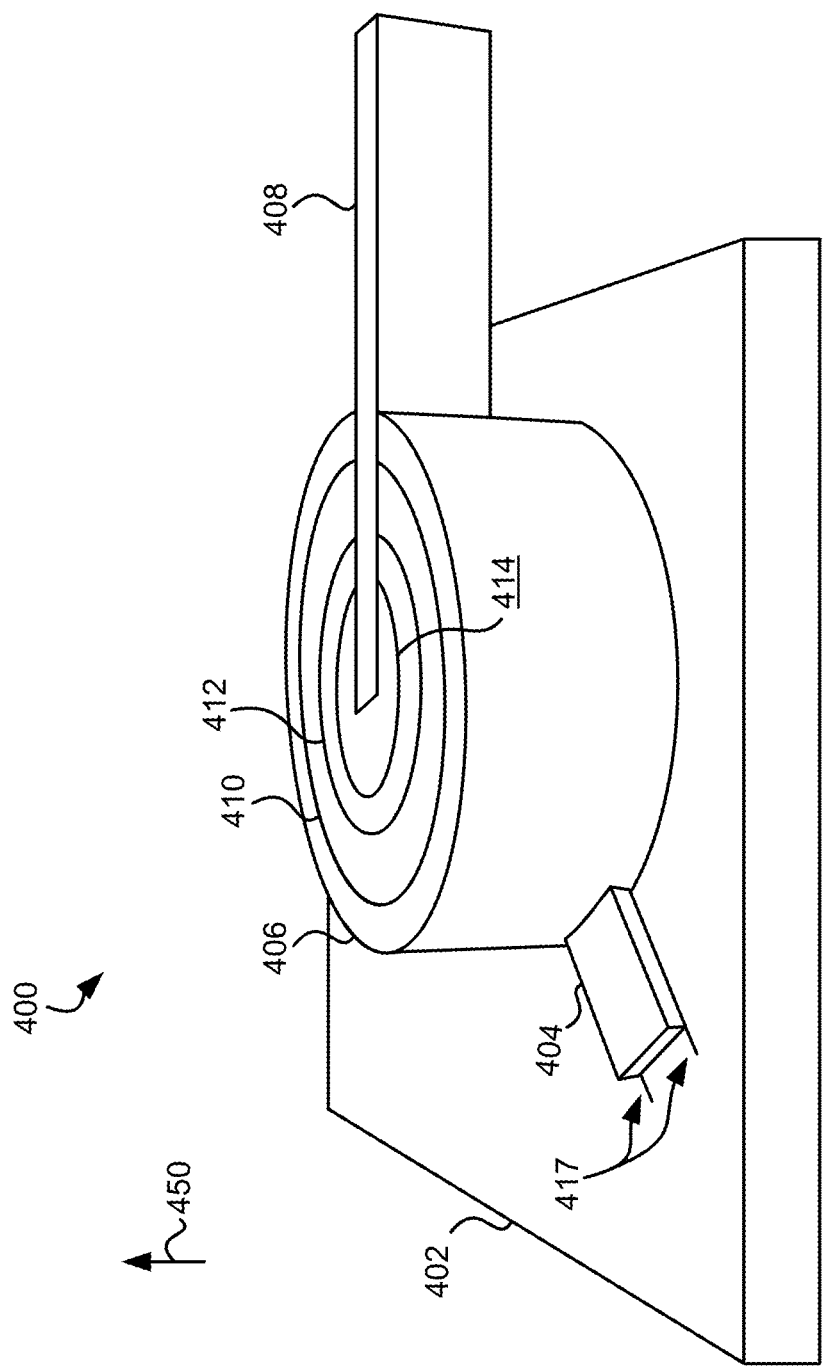
FIG. 4A is a partial perspective view of a vertical annular cylindrical channel transistor structure according to one embodiment.

Referring now to FIG. 4A, a partial perspective view of a vertical annular cylindrical channel transistor structure 400 (e.g., a switching device) is illustrated in accordance with one embodiment. As an option, the present transistor structure 400 may be implemented in conjunction with features from any other embodiment listed herein, such as those described with reference to the other FIGS., e.g., such as FIGS. 2-3. Of course, however, such transistor structure 400 and others presented herein may be used in various applications and/or in permutations which may or may not be specifically described in the illustrative embodiments listed herein. Further, the transistor structure 400 presented herein may be used in any desired environment.

The vertical annular cylindrical channel transistor structure 400, or "switching device", is preferably formed from a solid block of material. Accordingly, the substrate 402 shown in FIG. 4A may actually be the remainder of a block of material used to form one or more underlying layers of the general resulting annular cylindrical structure of the vertical annular cylindrical channel transistor structure 400, e.g., according to the various processes described in method 500 of FIGS. 5A-5S below.

With continued reference to FIG. 4A, the substrate 402 preferably includes silicon. For example, in some approaches the substrate 402 may be a remaining portion of a <110> crystalline silicon wafer (or any other desired type of wafer material) used to form the vertical annular cylindrical channel transistor structure 400. However, the substrate 402 may be a remaining portion of a different type of silicon and/or a different material altogether depending on the desired approach.

The transistor structure 400 also includes a central vertical pillar structure which may serve as the gate contact 414 for the transistor structure 400. Although not visible in the present reference frame, it is preferred that the gate contact 414 extends all the way down to the substrate 402. The central vertical pillar gate contact 414 also preferably includes an electrically conductive material which may be doped. Depending on the approach, the gate contact 414 may include a material which is doped differently depending on the type of transistor structure is desired. For example, in some approaches the gate contact 414 may be an n-type doped material which may result in the transistor structure 400 to be an n-type transistor. In other approaches the gate contact 414 may be a p-type doped material which may result in the transistor structure 400 to be a p-type transistor. Moreover, the gate contact 414 may be doped using diffusion doping, ion implantation, in-situ doping, etc., e.g., as will be described in further detail below.

Figure 4B:
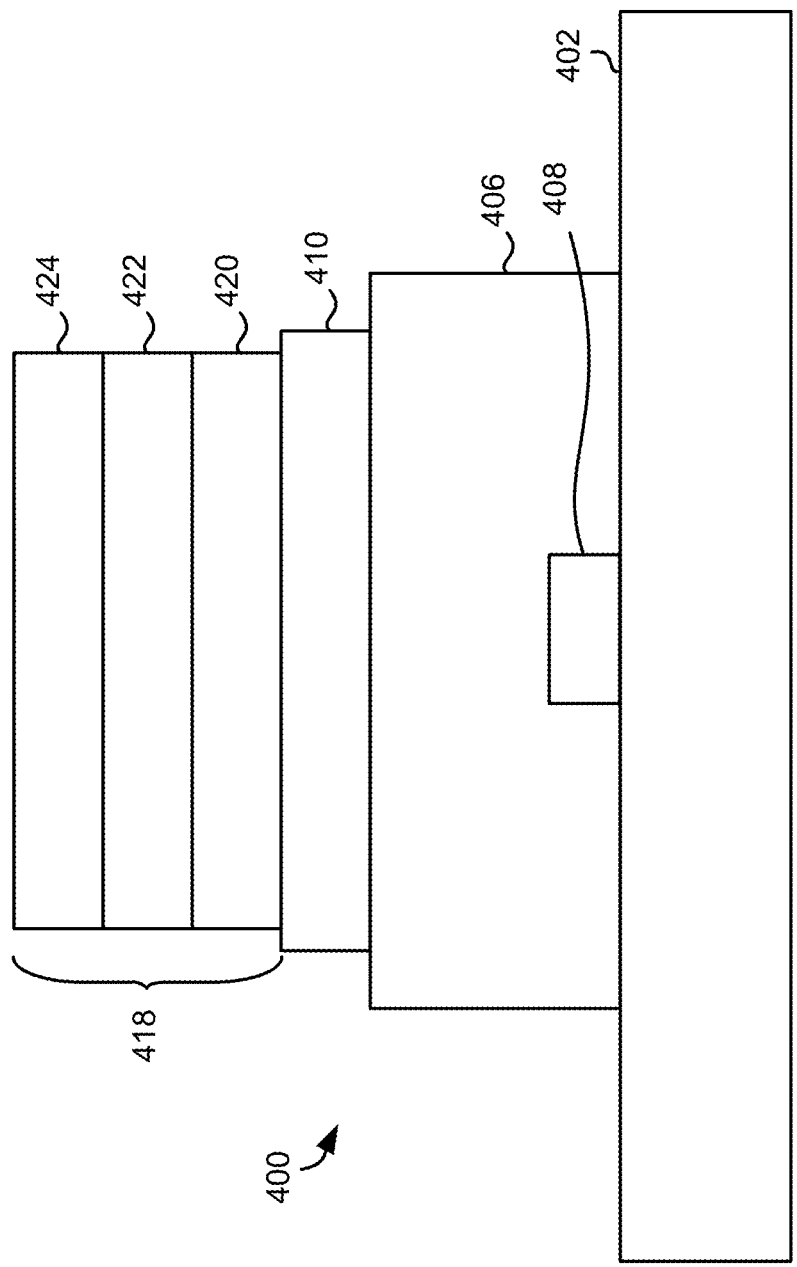
FIG. 4B is a partial cross-sectional view of the vertical annular cylindrical channel transistor structure in FIG. 4A according to one embodiment.

The transistor structure 400 also includes an annular cylindrical oxide layer 412 which encircles a majority of the central vertical pillar gate contact 414. Thus, in some approaches the annular cylindrical oxide layer 412 may extend all the way down to the substrate 402 as well. Moreover, an annular cylindrical channel 410 surrounds a majority of the annular cylindrical oxide layer 412. An upper region of the annular cylindrical channel 410 of the transistor structure 400 (relative to the deposition direction 450) may serve as the drain contact thereof, while a bottom region of the annular cylindrical channel 410 of the transistor structure 400 (relative to the deposition direction 450) may serve as the source contact thereof. However, depending on a voltage potential applied across the annular cylindrical channel 410, the bottom region may serve as the drain contact while the upper region serves as the source contact, e.g., as would be understood by one skilled in the art after reading the present description. Accordingly, the channel 410 may include an electrically conductive material which extends through a central portion of the transistor structure 400, although only a top portion of the channel 410 is shown in FIG. 4A because of the frame of reference afforded by the partial perspective view. Moreover, although not illustrated in the present embodiment, the channel 410 may also be used to couple the transistor structure 400 to a MTJ sensor stack in order to form a complete MRAM cell, e.g., as shown in FIG. 4B.

Referring still to FIG. 4A, the channel 410 is actually preferably formed from an original block of material as mentioned above, and therefore is actually a defined extension of the substrate 402 which preferably includes silicon.

In other words, although the substrate 402 and channel 410 are labeled differently, they are preferably portions of the same original block of material, e.g., as will be described in further detail below.

The annular cylindrical oxide layer 412 is also shown as being positioned between the annular cylindrical channel 410 and the central vertical pillar gate contact 414. Moreover, because the annular cylindrical channel 410 and the central vertical pillar gate contact 414 (drain contact) are only separated by the annular cylindrical oxide layer 412, it follows that the annular cylindrical oxide layer 412 preferably serves as an electrical insulator. Accordingly, the annular cylindrical oxide layer 412 may include electrically insulative materials in order to prevent the annular cylindrical channel 410 and the central vertical pillar gate contact 414 (drain contact) from shorting. Furthermore, a second annular cylindrical oxide layer 406 surrounds a majority of the annular cylindrical channel 410. Depending on the approach, the annular cylindrical oxide layers 412, 406 may include the same, similar or different materials and/or may be formed using the same, similar or different processes, e.g., as would be appreciated by one skilled in the art after reading the present description.

The transistor structure 400 also includes a source contact tab 404 which is directly coupled to the substrate 402. The source contact tab 404 is also configured such that it extends through the second annular cylindrical oxide layer 406 and directly couples to a bottom portion (e.g., base) of the annular cylindrical channel 410. Accordingly, the source contact tab 404 may encircle (e.g., surround) at least a portion of the annular cylindrical channel 410 in some approaches. The source contact tab 404 is also shown as extending away from the general vertical cylindrical structure of the vertical annular cylindrical channel transistor structure 400. This may desirably allow for an electrical connection to be formed with the annular cylindrical channel 410 by drilling down to the source contact tab 404 and forming a connection therewith, e.g., such that a voltage may be selectively applied to a base of the annular cylindrical channel 410 in addition to the voltage which may be applied to the top of the annular cylindrical channel 410 by the gate contact tab 408. It follows that the source contact tab 404 and the annular cylindrical channel 410 may include the same or similar materials. Furthermore, the source contact tab 404 also includes leads 417 which may be used to electrically couple the source contact tab 404 to a common word line which runs between a plurality of transistor structures 400 (e.g., see FIG. 7 below).

Further still, a gate contact tab 408 is shown as extending outward from the central vertical pillar gate contact 414. Accordingly, the central vertical pillar gate contact 414 is preferably electrically coupled to the gate contact tab 408 which may include a same or similar material as the central vertical pillar gate contact 414. However, it should be noted that the gate contact tab 408 is not electrically coupled to the annular cylindrical channel 410, thereby avoiding an electrical short between the annular cylindrical channel 410 and the central vertical pillar gate contact 414. Thus, an oxide or other electrically insulating material may be deposited into the recess which the gate contact tab 408 is formed in prior to forming the gate contact tab 408, e.g., as will be described in further detail below.

Looking now to FIG. 4B, a non-cross-sectional side view of the vertical annular cylindrical channel transistor structure 400 in FIG. 4A is shown having a MTJ sensor stack coupled thereto, in accordance with one embodiment. In other words, FIG. 4B illustrates an application-based variation of the embodiment of FIG. 4A. Accordingly, various components of FIG. 4B have common numbering with those of FIG. 4A. Moreover, it should be noted that the resulting structure illustrated in FIG. 4B may be implemented in conjunction with features from any other embodiment listed herein, such as those described with reference to the other FIGS.

As described above, the source contact tab 404 is directly coupled to the substrate 402 as well as a base of the annular cylindrical channel 410. Moreover, although not shown in the present frame of reference in FIG. 4B, the channel 410 is also preferably an extension of the substrate 402. As mentioned above, the channel 410 and substrate 402 may be effectively sculpted (formed) from an original solid block of material, and therefore are portions of the same original block of material despite having different reference numbers. Also, the second cylindrical oxide layer 406 encircles a majority of the annular cylindrical channel 410.

Furthermore, the gate contact tab 408 is coupled to the central vertical pillar gate contact (see 414 in FIG. 4A) and the gate contact tab 408 also extends away from the transistor structure 400 in a lateral direction along the deposition plane.

The thickness of each of the respective annular cylindrical layers 412, 410, 406 may vary depending on desired performance characteristics of the vertical annular cylindrical channel transistor structure 400 and/or threshold voltage requirements thereof. For example, the threshold voltage for n-type and p-type devices may be individually tailored by adjusting (e.g., selectively tuning) the dopant level used of the vertical annular cylindrical channel transistor structure 400, the thickness of the annular cylindrical channel 410, the annular cylindrical oxide layer 406, etc.

As alluded to above, the top portion of the annular cylindrical channel 410 may serve as the drain contact for the transistor structure 400. Accordingly, the channel 410 is shown as extending in a vertical direction to meet a MTJ sensor stack 418. The MTJ sensor stack 418 may include any of the approaches described herein, e.g., such as those included in FIGS. 2-3. Thus, the MTJ sensor stack 418 may include at least a reference layer 420, a tunnel barrier layer 422, and a free layer 424 included therein. As described above, the magnetic orientation of the free layer 424 may be selectively set by applying a current to the MTJ sensor stack 418 in one of two directions through the layers thereof. By selectively setting the magnetic orientation of the free layer 424, a bit of data (logical "1" or logical "0") is written to the MTJ sensor stack 418 and stored therein.

The functional performance which the structural characteristics of the vertical annular cylindrical channel transistor 400 illustrated in FIGS. 4A-4B provides are significant improvements compared to conventional products. Not only are the vertical transistor structures described herein able to successfully increase the drive currents used in the MRAM devices, but they are also able to increase the achievable storage density of the MRAM itself. As mentioned above, the increase in drive current is achieved by flowing the operating current in the vertical direction while using the same photolithography capability which increases the width of the channel from the conventional lateral size. Moreover, by vertically arranging and constructing the various components of these transistors, the effective footprint of each MRAM cell is significantly reduced, thereby producing the increased storage density.

These significant improvements to performance of MRAM provide concrete evidence that the various approaches included herein overcome the shortcomings associated with conventional products. Moreover, these improvements are the result of the different components and resulting structures implemented in the vertical annular cylindrical channel transistors included herein. Accordingly, the processes implemented to form these vertical annular cylindrical channel transistors differ greatly from conventional surface transistor formation processes as well, e.g., as will soon become apparent.

Figure 5A:
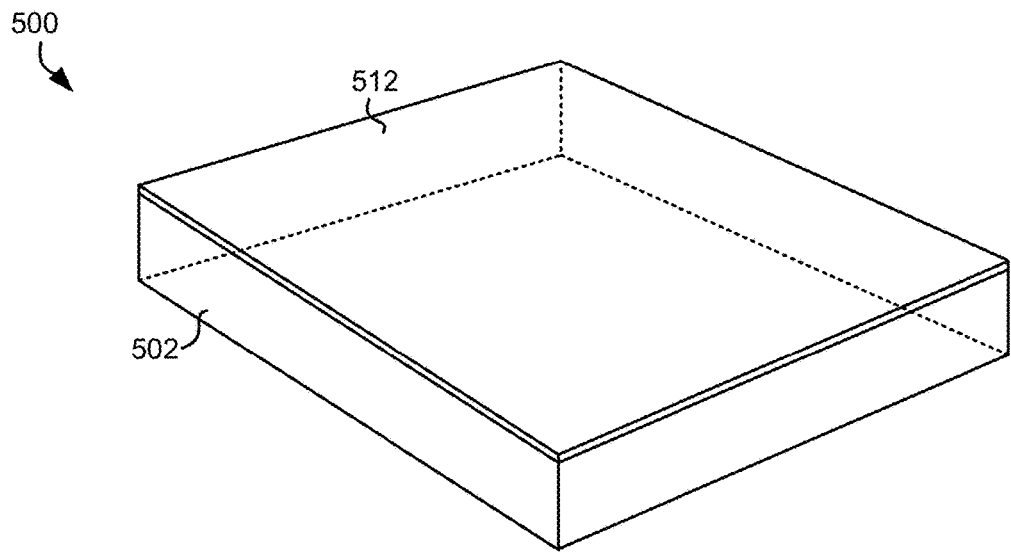
FIGS. 5A-5S are partial perspective views of a method for forming a vertical annular cylindrical channel transistor structure according to one embodiment.
Figure 5B:
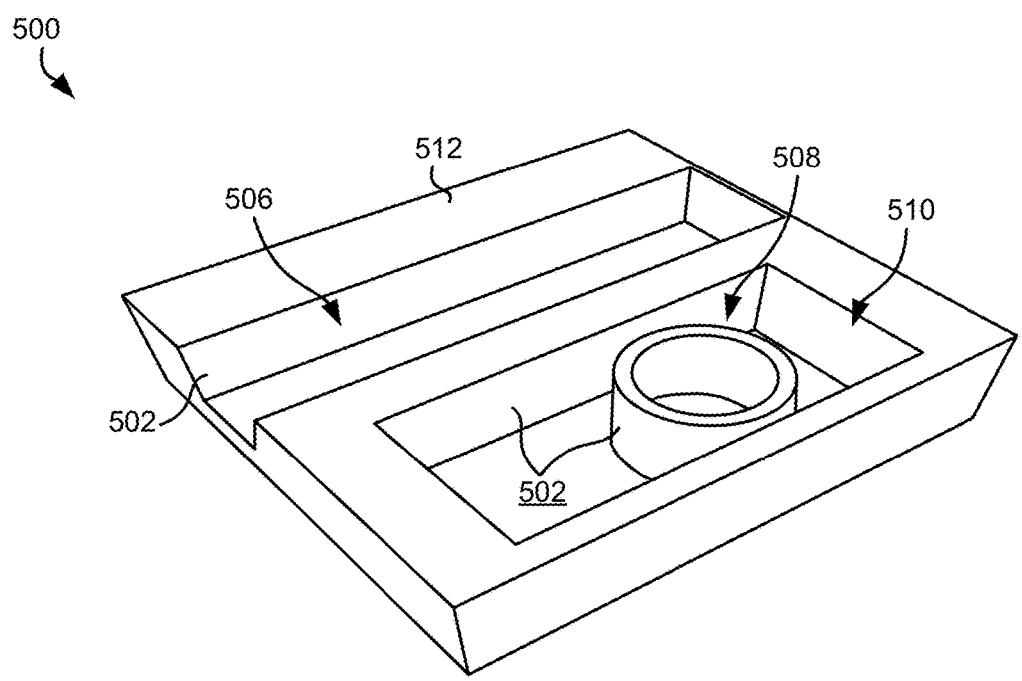
Figure 5C:
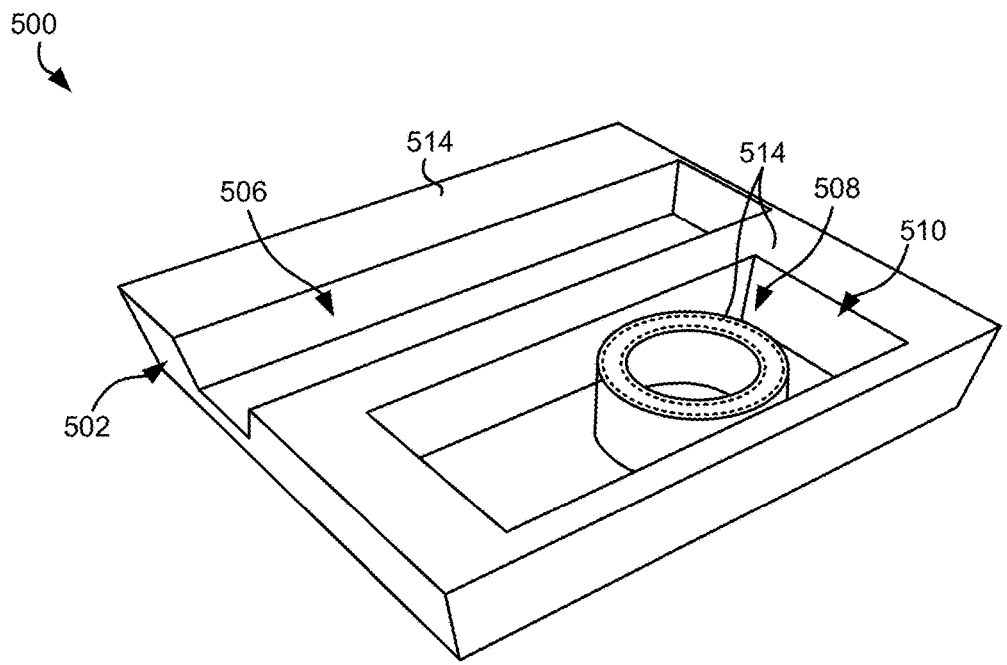
Figure 5D:
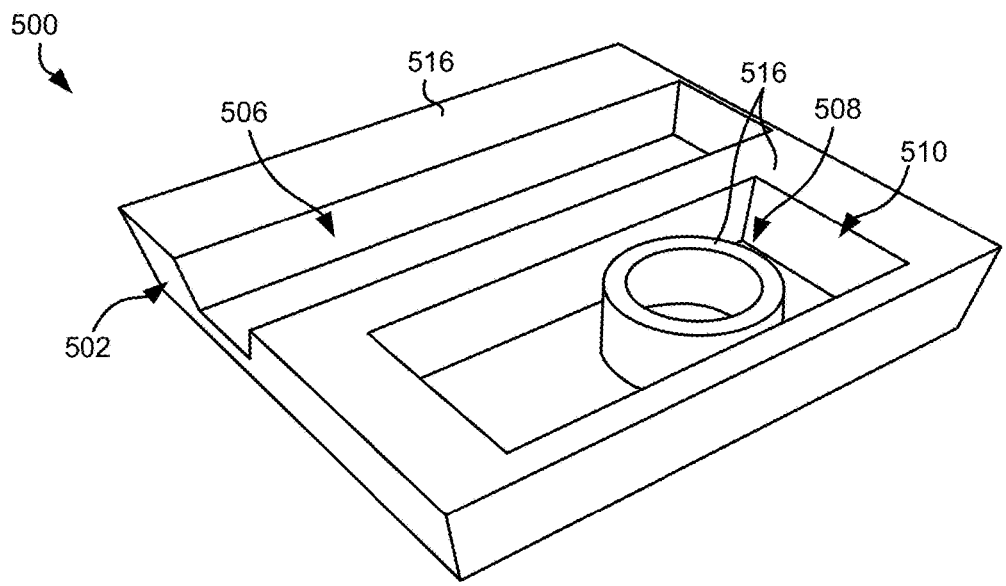
Figure 5E:
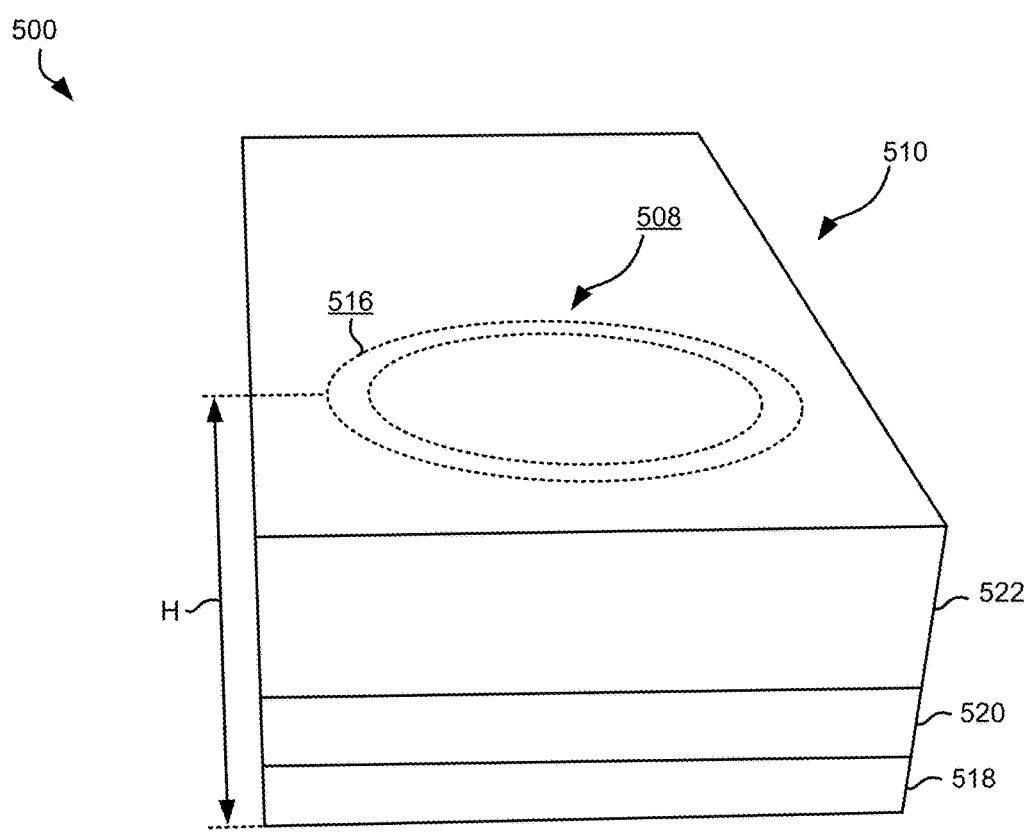
Figure 5F:
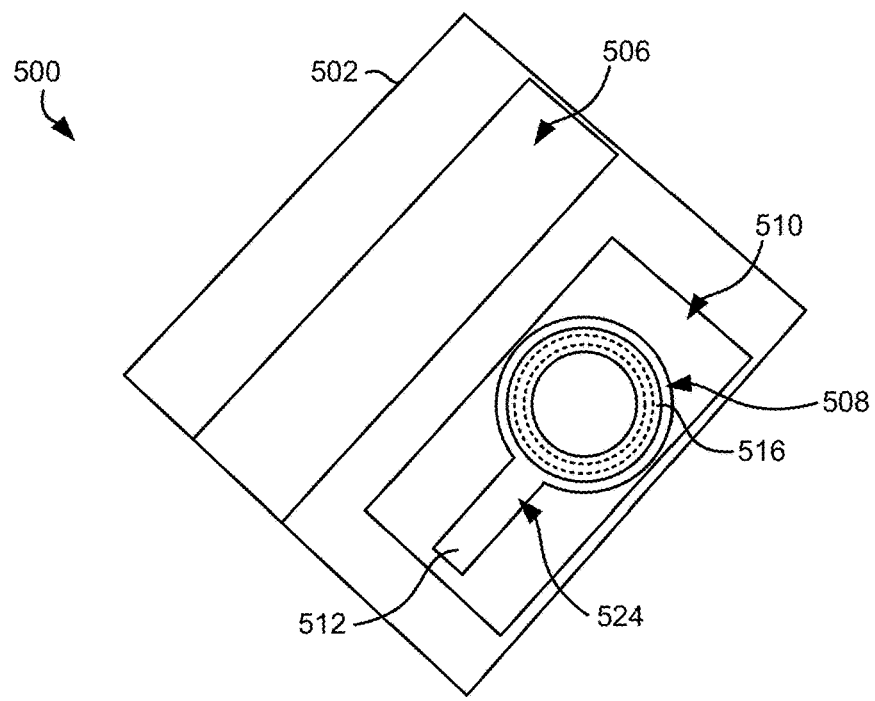
Figure 5G:
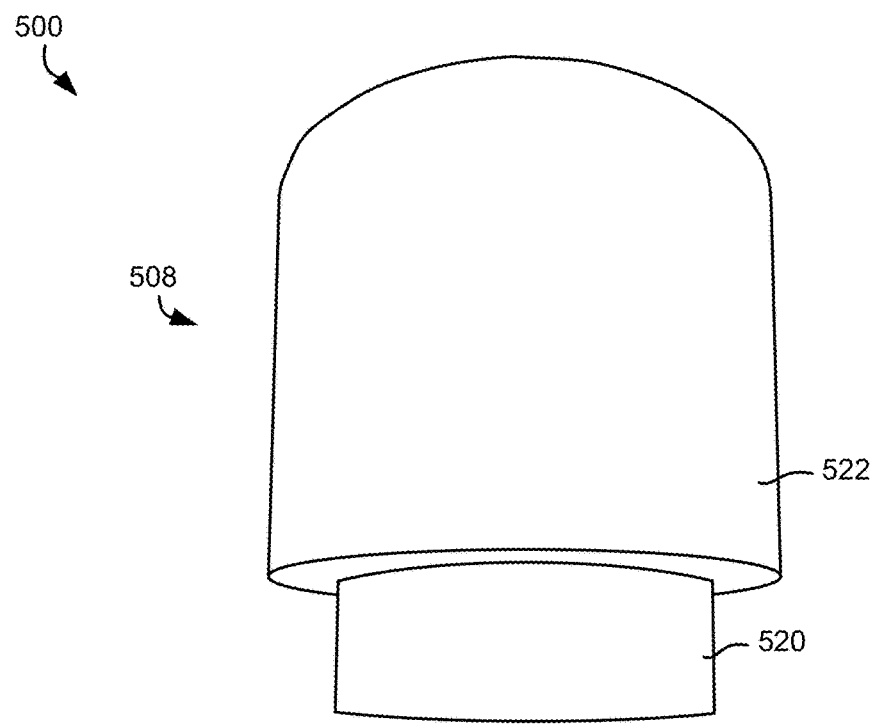
Figure 5H:
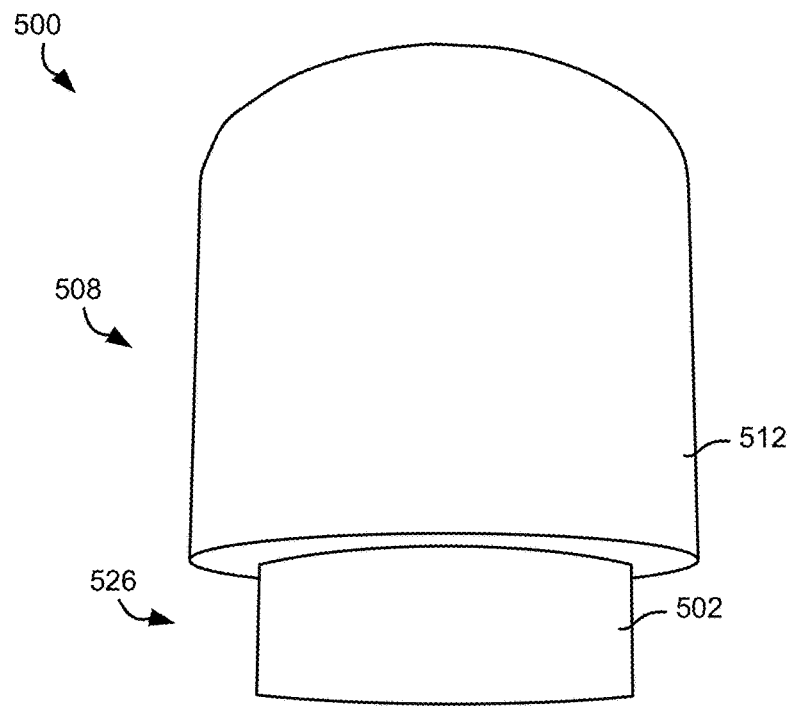
Figure 5I:
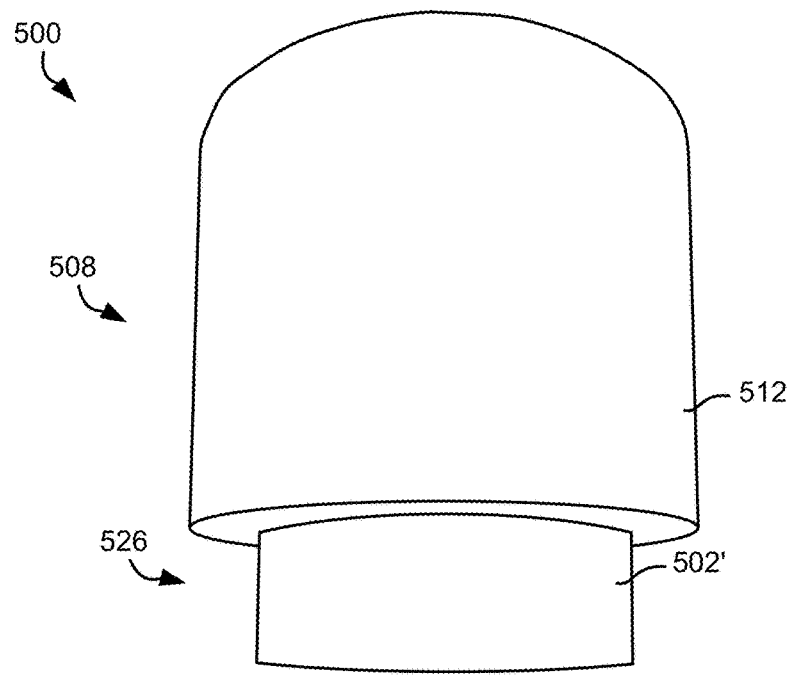
Figure 5J:
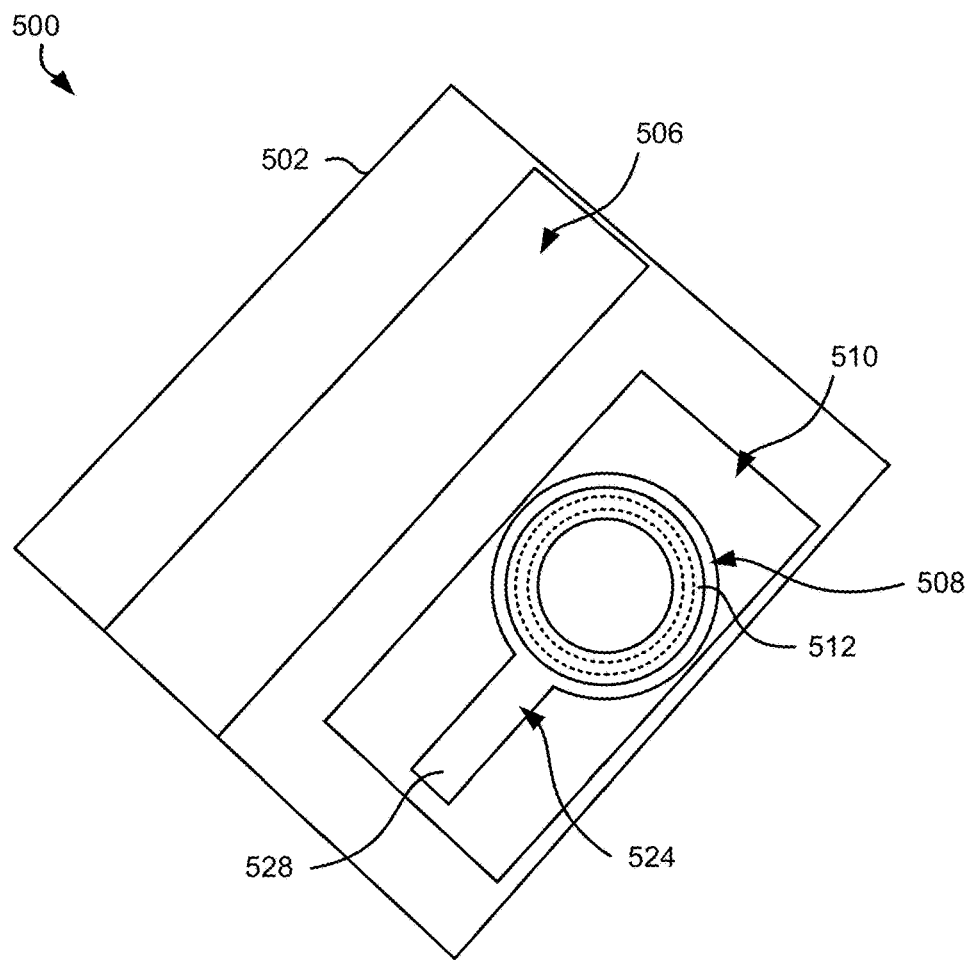
Figure 5K:
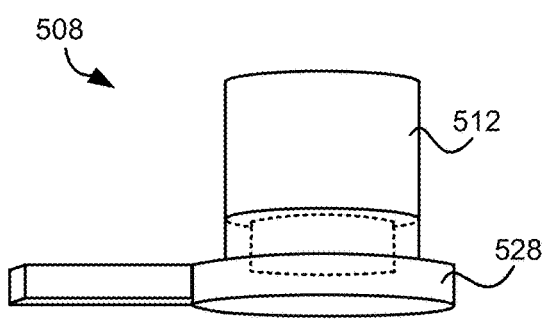
Figure 5L:
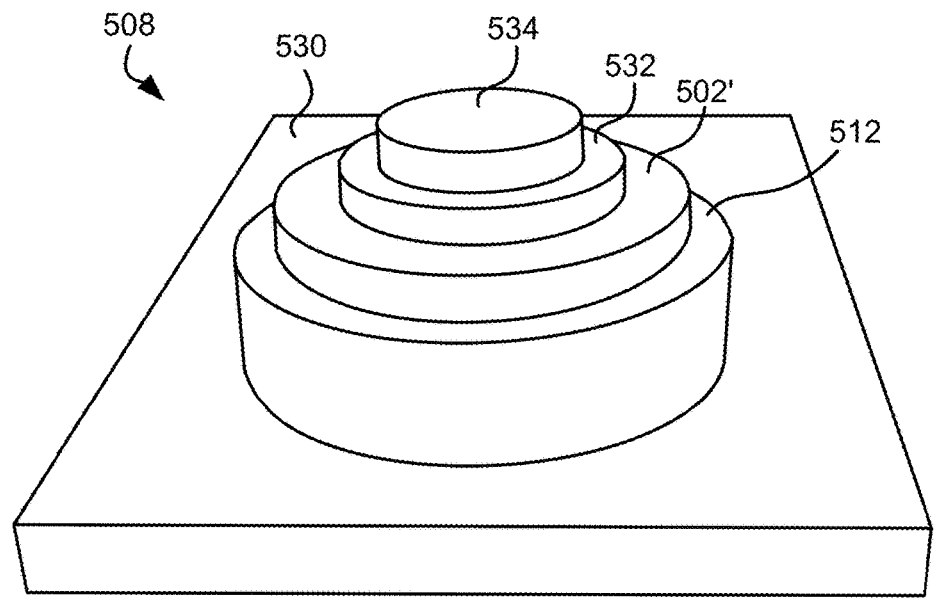
Figure 5M:
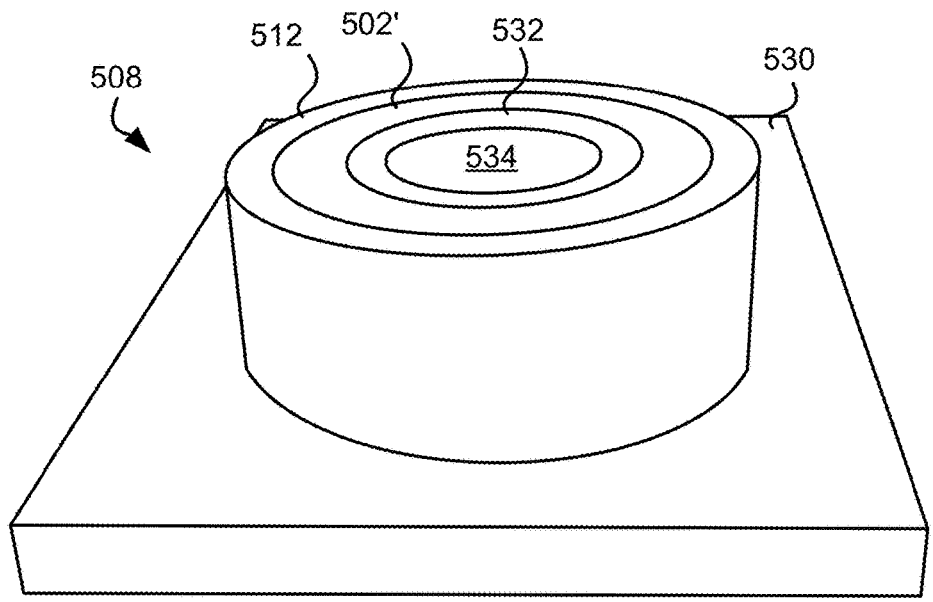
Figure 5N:
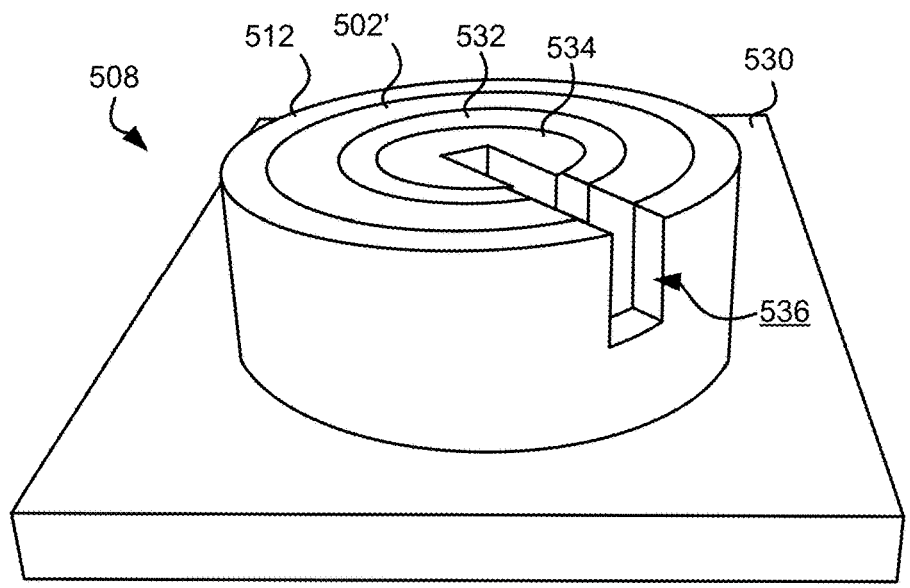
Figure 5O:
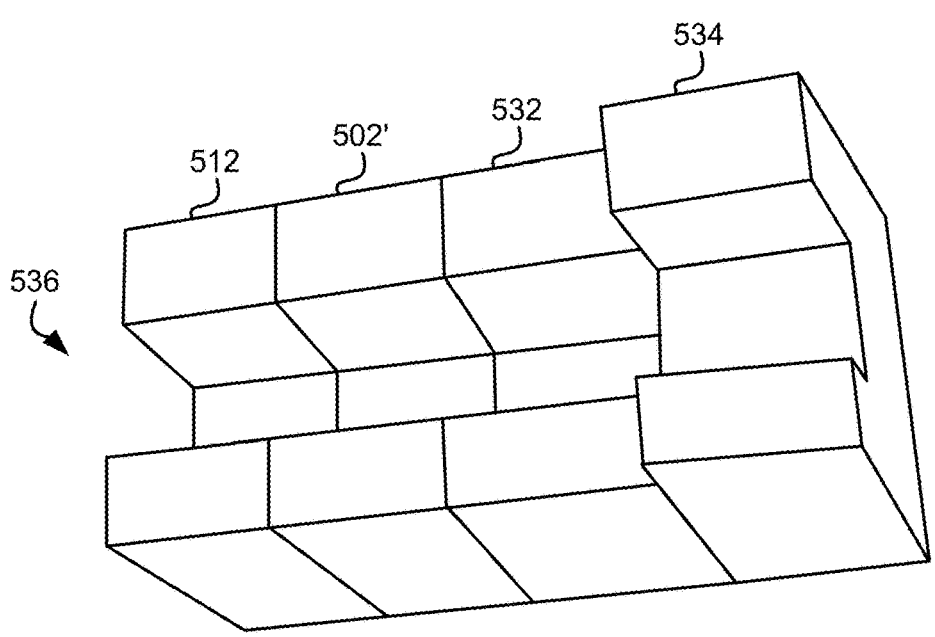
Figure 5P:
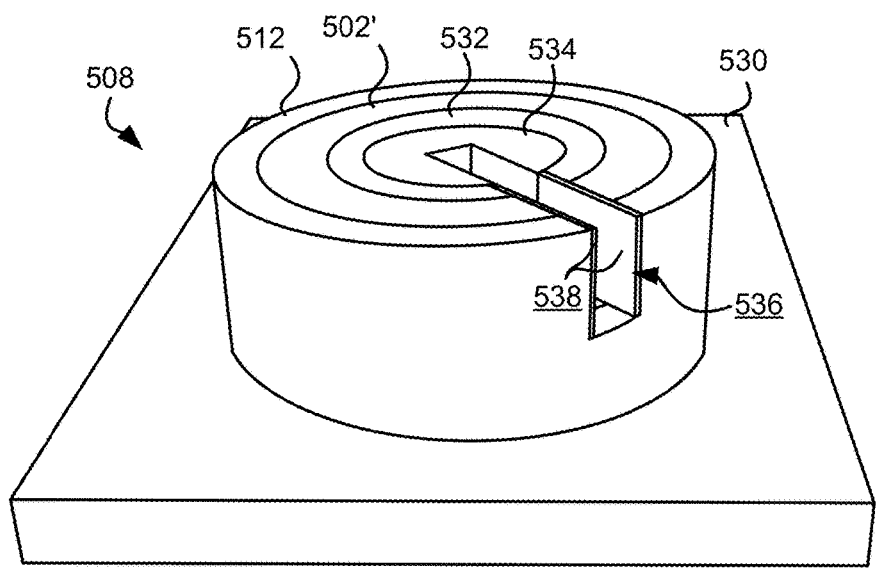
Figure 5Q:
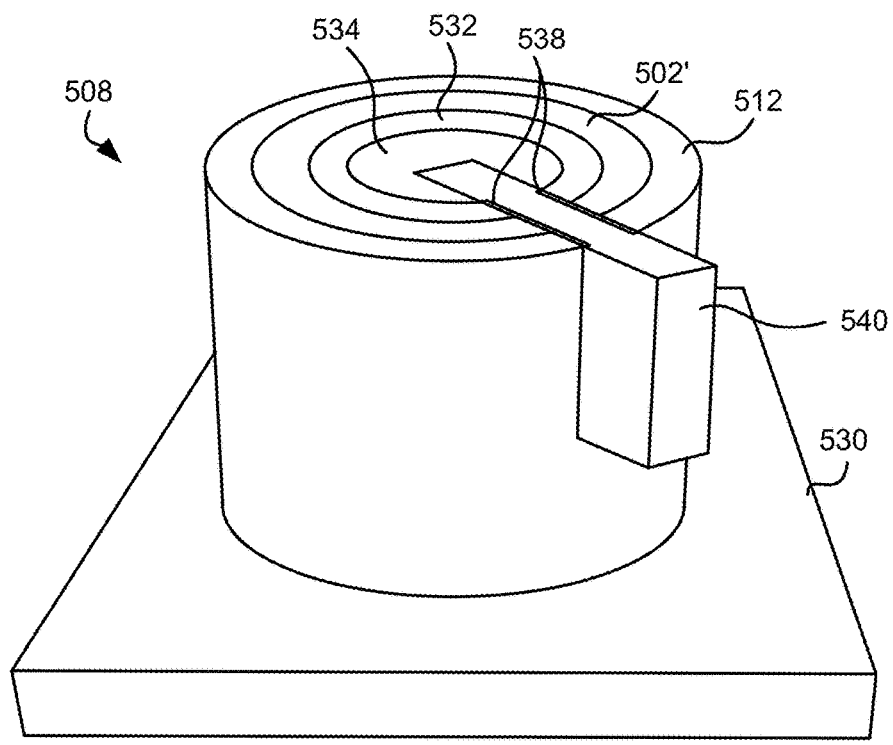
Figure 5R:
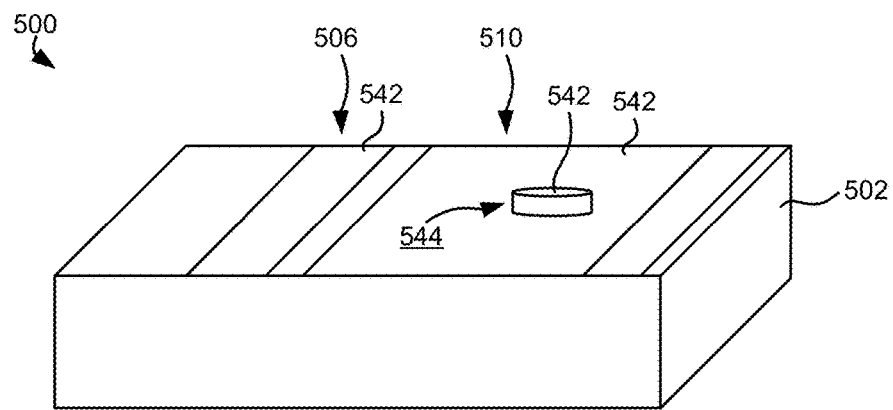
Figure 5S:
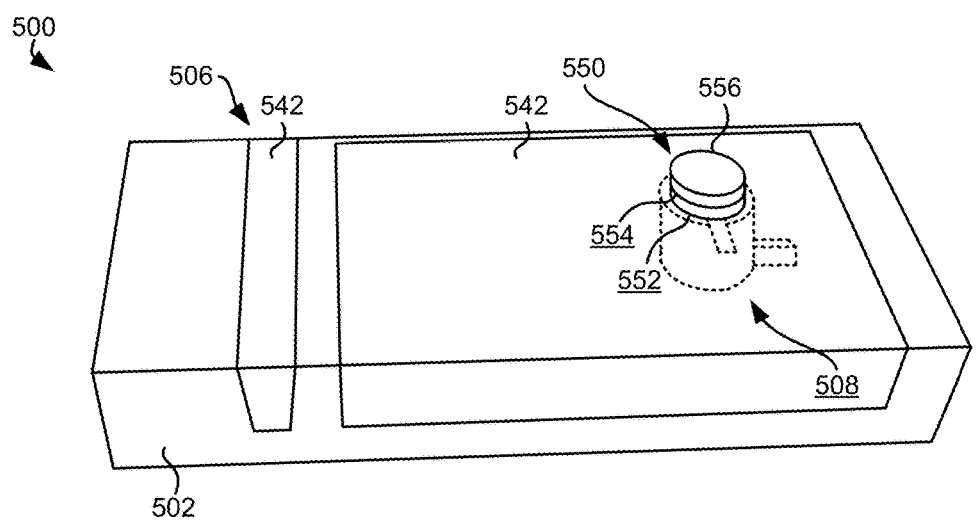

Looking now to FIGS. 5A-5S, various processes of an exemplary fabrication method 500 for forming a vertical annular cylindrical channel transistor is illustrated in accordance with one embodiment. The method 500 may be performed in accordance with the present invention in any of the environments depicted in FIGS. 2-4B, among others, in various embodiments. Of course, more or less operations than those specifically described in FIGS. 5A-5S may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, a processor, etc., or some other device having one or more processors therein which is able to communicate with (e.g., send commands to and/or receive information from) various fabrication components which would be apparent to one skilled in the art after reading the present description. The processor, e.g., processing circuit(s), chip(s), and/or module (s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art. Moreover, it should be noted that the various approaches described in relation to method 500 may be used to form any desired type of complementary metal-oxide-semiconductor CMOS and/or MOS devices and/or Bipolar junction devices.

As shown in FIG. 5A, method 500 begins with a solid block of substrate material 502. As described above, the solid block of substrate material 502 preferably includes silicon, e.g., such as crystalline silicon, but may include any desired material depending on the approach.

A thin oxide layer 512 is preferably formed on the exposed surfaces of the substrate material 502. The oxide layer 512 may be formed using any desired process, e.g., such as thermal oxidation. Thus, depending on the specific substrate material 502 used, the oxide layer 512 may have an effect on the material characteristics of the substrate material 502. For example, at least a portion of a silicon substrate material 502 may be turned into silicon dioxide by the formation of the oxide layer 512.

Progressing to FIG. 5B, the substrate material 502 is shown as having recessed portions which define a shallow trench isolation (STI) region 506 and a vertical annular cylindrical 508 structure, also referred to herein as a "vertical annular cylinder 508". As mentioned above, because the vertical annular cylindrical 508 structure is formed from a solid block of material (e.g., silicon), the vertical annular cylinder 508 may actually be an extension of the remainder of the substrate material 502. In other words, the vertical annular cylinder 508 may actually be the same layer as the substrate material 502. It should be noted that the top portion of the vertical annular cylinder 508 will eventually serve as the annular cylindrical drain contact (or channel 410 as seen in FIGS. 4A-4B).

The vertical annular cylinder 508 may be formed from the substrate material 502 by applying a mask to an upper surface of the block of substrate material 502. The mask preferably defines the outer extents of the STI region 506, the outer extents of the recessed region 510 in which the vertical annular cylinder 508 located, as well as the inner and outer surfaces of the vertical annular cylinder 508 itself. After applying the mask, an etching process may be employed to form the recessed regions 506, 510 of the substrate material 502, thereby defining the insulating STI region 506 and the vertical annular cylinder 508 active region. Depending on the desired approach, any desired form of etching may be performed. Moreover, it should be noted that forming the STI region 506 may involve performing additional etching compared to the recessed region 510 in which the vertical annular cylinder 508 located, or vice versa depending on the approach. However, in some approaches which implement low voltage devices (e.g., such as MRAM devices), additional etching of region 506 may not be performed. In other words, only high voltage devices may include forming the additional depth of STI 506 regions of the substrate.

The dimensions of the vertical annular cylindrical 508 structure formed may have an effect on the performance of the resulting transistor structure created. For instance, increasing the thickness (measured along the deposition plane) of the annular vertical walls of the vertical annular cylindrical structure 508, may cause an increase in the amount of current the resulting transistor is able to pass therethrough. Thus, the amount of current the vertical annular cylindrical 508 structure is able to pass to a MTJ sensor structure coupled thereto, may be adjusted by tuning the thickness of the vertical walls of the annular cylindrical structure. Similarly, the height of the vertical annular cylindrical 508 structure (measured in the deposition direction) may have a direct effect on the speed at which the resulting transistor structure is able to pass current therethrough. Specifically, the shorter the height of the vertical annular cylindrical 508 structure, the quicker the vertical annular cylindrical 508 structure is able to pass a current therethrough. Thus, the height of the annular cylindrical structure 508 may be selectively tuned to adjust a performance speed of the resulting memory array in which the final transistor structure (e.g., see FIG. 5S below) is implemented. According to an illustrative approach, which is in no way intended to limit the invention, by selectively adjusting the annular vertical wall thickness and/or height of the vertical annular cylindrical 508 structure, the resulting transistor structure may be able to pass significantly more current therethrough compared to conventional surface MOS transistor structures, e.g., as would be appreciated by one skilled in the art after reading the present description.

Moving to FIG. 5C, once the STI region 506 and vertical annular cylinder 508 are crafted, another thin layer of oxide 514 is preferably formed over all exposed surfaces of the resulting structure. As a result, the outer extents of the silicon vertical annular cylinder 508 are shown with dashed lines. The oxide layer may be formed using any of the processes described above. In order to achieve a smoother horizontal, vertical and annular surfaces of the resulting structure shown in FIG. 5C, a short oxidation followed by etching of dielectric SiO2 processes may be implemented to remove any asperities that may have occurred when etching the substrate Si. Once the short wet etching process has concluded, another thin oxide layer may be formed by thermal oxidation, which may again be followed by a short etching process. These oxide growth and etching processes may be repeated any desired number of times such that a smooth, uniform layer of oxide 514 is ultimately formed on the surface of the resulting structure shown in FIG. 5C. The repeated small (e.g., slight) thermal oxidation of particularly Si substrates and wet etching back causes the resulting Si surfaces to be clear of Silicon surface imperfections, thereby causing the resulting layer to have faster mobility and/or speed of current carrier electrons and/or holes, e.g., as would be appreciated by one skilled in the art after reading the present description.

A mask (not shown) is also preferably applied to the resulting structure shown such that only the vertical annular cylinder 508 and overlying oxide 514 are exposed. Moreover, one or more doping processes are preferably performed on the vertical annular cylinder 508 such that the annular cylinder may become a doped layer. According to one example, a doped material may be deposited on at least a portion of the annular cylindrical channel 508. The vertical annular cylinder 508 may be doped with p-type materials and/or n-type materials depending on the type of resulting transistor structure that is desired. In other words, the doped material may be an n+ doped material and/or a p+ doped material. For example, in some approaches the vertical annular cylinder 508 may be doped with an n-type dopant and/or material (e.g., such as phosphorus) which may result in the transistor structure formed by method 500 to be an n-type transistor. In other approaches the vertical annular cylinder 508 may be doped with a p-type dopant and/or material (e.g., such as boron) which may result in the transistor structure formed by method 500 to be a p-type transistor. A specific type of resulting transistor structure may be desired as opposed to another because of the operating voltage of the resulting transistor structure that the different type of dopants induce, e.g., as would be appreciated by one skilled in the art after reading the present description. Moreover, the vertical annular cylinder 508 may be doped using diffusion doping, a high angled multiple ion implant doping process, ion implantation, in-situ doping, etc., which preferably occurs after the vertical annular cylinder 508 is formed.

After the desired doping material(s) have been applied to the vertical annular cylinder 508, a rapid thermal annealing process is preferably performed on the resulting structure. The rapid thermal anneal process activates the dopants, thereby transferring their properties to the vertical annular cylinder 508. Furthermore, depending on the approach, any desired type of rapid thermal anneal processes may be conducted. Any portions of the doping material(s) which were not activated (e.g., effected) by the rapid thermal annealing process may also be removed using any desired process which would be apparent to one skilled in the art after reading the present description.

Looking now to FIG. 5D, another thin oxide layer 516 is preferably formed on the exposed surfaces of the resulting structure. According to an illustrative approach, the oxide layer 516 may be a thin layer of SiO2 which may actually be grown on the exposed surfaces of the resulting structure in FIG. 5D, e.g., using any desired processes. The oxide layer 516 may actually help facilitate the formation (e.g., deposition) of silicide materials thereover, e.g., as will soon become apparent.

Referring to FIG. 5E, a detailed side view of the general recessed region 510 is shown in order to see the various layers deposited therein, which is in no way intended to limit the invention. As shown, an organic polymer layer 518 is first deposited at a base of the vertical annular cylinder 508, preferably both inside and outside the cylinder structure itself. The organic polymer layer 518 may be deposited using a spin coating process in some approaches. Moreover, the organic polymer layer 518 may have a deposition thickness which is about 20% of a total height H of the vertical annular cylinder 508, but could be thicker or thinner depending on the desired approach. Moreover, in some approaches the organic polymer layer 518 may be formed and then thinned down to a desired deposition thickness.

A low temperature layer SiO2 layer 520 is also formed on the organic polymer layer 518 as shown in FIG. 5E. It follows that the SiO2 layer 520 is preferably formed in a low temperature environment, e.g., such as a refrigerated room, which is at least colder than a normal fabrication environment. A bottom anti-reflecting coating 522 is also formed on the SiO2 layer 520 using any desired processes. Moreover, the anti-reflecting coating 522 may be of any desired type depending on the desired approach. Specifically, according to a preferred approach, the anti-reflecting coating 522 may also include a photo resist material, e.g., as would be appreciated by one skilled in the art after reading the present description. The anti-reflecting coating 522 (and photo resist material) may be deposited over the oxide layer 516 which is positioned over a top surface of the vertical annular cylinder 508 as described above. However, it is preferred that a removal process is performed on the anti-reflecting coating 522 which exposes an upper surface of the oxide layer 516 or keeps it just below the surface of the anti-reflecting coating 522, e.g., as represented by the dashed lines seen in FIG. 5E.

An etching process may also desirably be performed on the resulting structure shown in FIG. 5E. Thus, progressing to FIG. 5F, a top-down view of the structure after the etching process has been performed is shown. The recess 524 formed by the etching process surrounds the vertical annular cylinder structure 508 and preferably extends all the way down to the oxide layer 512 formed on the substrate material 502. Thus, the etching process preferably removes a select area of the anti-reflecting coating 522, the SiO2 layer 520, and the organic polymer layer 518, thereby exposing the underlying oxide layer 512. However, in some approaches the etching process may also remove the oxide layer 512 thereby exposing the substrate material 502.

According to some approaches, the etching process may be a dry etching process. Moreover, the etching process is preferably performed in the vertical direction (into the page) which is parallel to the deposition direction. Accordingly, a portion of the anti-reflecting coating 522, the SiO2 layer 520, and the organic polymer layer 518 may remain around the exterior of the vertical sides of the vertical annular cylinder 508. Accordingly, looking to FIG. 5G, a detailed view of the vertical annular cylinder 508 is shown which includes the outermost anti-reflecting coating 522. Moreover, an exterior base (e.g., bottom) portion of the vertical annular cylinder 508 is shown as being partially removed, thereby exposing the underlying SiO2 layer 520. The SiO2 layer 520 may be exposed as a result of the etching process performed in FIG. 5F and/or the processes implemented to form the resulting vertical annular cylinder 508 structure shown in FIG. 5G.

Moving to FIG. 5H, an etching process is preferably performed in the horizontal (e.g., lateral) direction along the deposition plane. Depending on the desired approach, a dry etching process and/or a wet etching process may be performed on the vertical annular cylinder 508. For approaches implementing a dry etching process, a very high temperature dry etching process is preferably used. Moreover, the very high temperature dry etching process may use NF3, SF6, etc., gasses to perform the material removal process.

The etching process preferably removes the anti-reflecting coating 522, the SiO2 layer 520, the organic polymer layer 518 and underlying layers on the exterior base (e.g., bottom) portion 526 of the vertical annular cylinder 508, preferably such that the substrate material 502 is exposed. As mentioned above, the substrate material 502 preferably includes silicon. Therefore the exposed bottom portion 526 of the vertical annular cylinder 508 preferably includes silicon. Moreover, the oxide layer 512 is preferably exposed on a remainder of the vertical annular cylinder 508. In other words, the removal process forms a source contact recess which surrounds the base of the annular cylindrical channel 508 structure.

Moving to FIG. 5I, an ion implant process may be performed on the exposed portion at the base of the substrate material 502. The ion implant process may be performed on the substrate material 502 in order to pattern the material into a source contact, e.g., as will be described in further detail below. Moreover, following the ion implant process, a rapid thermal anneal process is performed on the resulting vertical annular cylinder 508 structure. As a result of performing the ion implant and rapid thermal anneal processes, the substrate material 502' may desirably experience source diffusion as would be appreciated by one skilled in the art after reading the present description.

Looking now to FIG. 5J, an electrically conductive material is deposited into the source contact recess 524, thereby forming an electrically conductive source contact tab 528. Moreover, because the substrate material 502 was exposed and patterned in the previous steps of method 500 seen in FIG. 5I above, the electrically conductive source contact tab 528 encircles (wraps around) the base of the vertical annular cylindrical 508 structure. As previously mentioned, the electrically conductive source contact tab 528 is also shown as extending away from the vertical annular cylindrical 508 structure which may desirably allow for an electrical connection to be formed with the annular cylindrical channel 508 by drilling down to the source contact tab 528 and forming a connection therewith, e.g., such that a voltage may be selectively applied to a base of the annular cylindrical channel 508. Thus in some approaches the source contact tab 528 and the annular cylindrical channel 508 may include the same or similar materials. However, the source contact tab 528 may include any desired electrically conductive material, e.g., such as titanium (Ti). However, it is preferred that the material used to form the source contact tab 528 is non-magnetic such that the operability of adjacent MTJ sensor stacks are not compromised during use in a memory array. Furthermore, the source contact tab 528 may also include leads (not shown) which may be used to electrically couple the source contact tab 528 to a common word line which runs between a plurality of transistor structures (e.g., see FIG. 7 below). Moreover, a deposition thickness of the source contact tab 528 may be about 50 nm, but could be thicker or thinner depending on the desired approach.

Once the electrically conductive material is deposited into the recess 524 thereby forming the source contact tab 528, a rapid thermal anneal process may be performed. Furthermore, a wet etching process may also be performed in order to remove any portions of the electrically conductive material is deposited into the recess 524 which did not react to the rapid thermal anneal process.

FIG. 5K illustrates a detailed view of the vertical annular cylinder 508 according to an exemplary approach in which the source contact tab 528 has been formed around the bottom portion of the vertical annular cylinder 508. As described above, a portion of the source contact tab 528 encircles an underlying bottom portion (e.g., source contact) of the vertical annular cylinder 508 which has been represented by the dashed lines. Moreover, a portion of the source contact tab 528 also extends away from the vertical annular cylinder 508, e.g., such that a lead may be drilled down and electrically coupled thereto.

A spin-on-glass (SOG) 530 material is preferably coated on the exposed surfaces of the resulting structure illustrated in FIG. 5J above. Once deposited, a high temperature annealing process may be performed to bake the SOG 530 coating. Moreover, a majority of the resulting structure may be masked such that the vertical annular cylinder 508 structures are exposed. An etching process may subsequently be performed on the exposed vertical annular cylinder 508 structure, e.g., such that an outer surface thereof may be cleaned of the SOG 530. In other words, the etching process preferably removes the SOG 530 coating from the vertical sides and top surface of the vertical annular cylinder 508 structure. Depending on the desired approach, a wet and/or dry etching process may be used to remove the SOG 530 from the vertical annular cylinder 508 structure. Accordingly, looking now to FIG. 5L, a detailed view of the vertical annular cylinder 508 stricture is shown surrounded by the SOG 530 layer, but without any of the other surrounding layers (e.g., structures).

The SOG 530 coating may be applied using any desired process(es), e.g., such as spin coating. Moreover, the SOG 530 coating may include any desired type of SOG material, e.g., such as glass titanate, glass silica, compound SOG materials, etc. Moreover the SOG 530 base material may be doped in some approaches with additional materials, e.g., such as boron, phosphorus, zinc, silica, etc., depending on the desired approach.

Referring still to FIG. 5L, an etching process is performed on a center portion of the vertical annular cylinder 508 stricture. In other words, an etching process is preferably performed on the vertical annular cylinder 508 stricture such that the material inside the inner surfaces of the annular cylinder 508 structure is removed, thereby exposing the substrate material 502' in a center of the vertical annular cylinder 508 stricture. Moreover, a cleaning process may be performed on the exposed portions of the substrate material 502'.

An oxide layer 532 is preferably deposited on the inner surfaces of the annular cylinder 508 stricture, thereby causing the oxide layer 532 to have an annular cylindrical shape as well. The oxide layer 532 may be formed using any desired process, and may eventually serve as a gate oxidation layer which separates the annular cylinder 508 stricture from an inner gate contact, e.g., as will soon become apparent. Thus, the oxide layer 532 preferably includes an electrically insulating material and is preferably thick enough to prevent the annular cylinder 508 stricture from an inner gate contact from shorting.

After the oxide layer 532 has been formed, an electrically conductive material is deposited into the remaining recessed center portion of the annular cylinder 508 stricture, thereby forming a cylindrical pillar gate contact 534 structure. The material used to form the gate contact 534 may include any desired electrically conductive material, e.g., such as Ti, TiN, etc., but is also preferably non-magnetic such that the operability of adjacent MTJ sensor stacks are not compromised during use in a memory array. Moreover, it should be noted that although the layers 512, 502', 532, 534 in FIG. 5L are shown as being formed in a stepped fashion along the deposition direction, this is in no way intended to be limiting, but rather is presented by way of example only.

Moving now to FIG. 5M, method 500 may further include performing a chemical-mechanical planarization process on an upper surface of the resulting structure shown above in FIG. 5L. The chemical-mechanical planarization process preferably defines a uniform (e.g., flush) upper surface of the annular cylinder 508 stricture, e.g., as shown. Moreover, a thin layer of electrically insulating material (not shown), e.g., such as SiN, may be deposited on the exposed surfaces of the resulting structure shown in FIG. 5M in some approaches. According to an illustrative approach, the electrically insulating material may be deposited using chemical vapor deposition process, and may have a deposition thickness of about 15 nm. Furthermore, another SOG layer (not shown) and/or a low temperature oxide layer (also not shown) may also be deposited over the SiN layer in some approaches.

Now looking to FIG. 5N, a recess 536 may be formed in order to form an electrical contact to the center gate contact 534. The recess 536 may be formed by first applying a mask to the annular cylinder 508 stricture, where the mask exposes only a portion of the top and vertical side of the annular cylinder 508 stricture. An etching process may then be performed on the portion of the annular cylinder 508 stricture which is exposed by the mask. According to some approaches, the etching process may be an ion beam trench etching process which is able to selectively etch through the oxide layer 512, the substrate material 502', oxide layer 532, and the center gate contact 534, e.g., as shown. However, it should be noted that the oxide layer 512, the substrate material 502', and the oxide layer 532 are etched slightly more than the center gate contact 534. This difference in the amount of material removed in the etching process is more readily apparent in the detailed view of the recess 536 shown in FIG. 5O.

Progressing to FIG. 5P, a thin layer of electrically insulating material 538 (e.g., such as SiN) is deposited on the exposed surfaces in the recess 536. Thereafter a chemical-mechanical planarization process may be used to selectively remove the electrically insulating material 538 from the exposed surfaces of the center gate contact 534, e.g., as seen in FIG. 5P. As a result, a gate contact may be formed in the recess 536 such that it is electrically coupled to the center gate contact 534 but also insulated from the substrate material 502', thereby avoiding an electrical short between the gate and channel of the resulting transistor structure.

Accordingly, looking now to FIG. 5Q, method 500 additionally includes forming the gate contact tab 540 in the recess 536. The gate contact tab 540 may include any desired electrically conductive, non-magnetic material. For example, the gate contact tab 540 may include TaN. Moreover, a damascene process may be performed on the gate contact tab 540, e.g., as would be appreciated by one skilled in the art after reading the present description. A chemical-mechanical planarization process may also be performed on the resulting structure in some approaches.

Moving to FIG. 5R, method 500 also includes depositing a thin layer of silicon dioxide (not shown in the present frame of reference) before filling the STI and general recessed regions 506, 510 with another SOG material 542 over (e.g., directly onto) the exposed surfaces of the resulting structure.

The SOG material 542 itself may be deposited into the STI and general recessed regions 506, 510 using any desired process(es). For example, in some approaches the SOG material 542 may be spin coated into the recessed regions 506, 510. Moreover, in the interest of achieving a smoother surface of the resulting structure shown in FIG. 5R, a short chemical-mechanical planarization (CMP) process may be implemented to remove any asperities that may have occurred when forming the SOG material 542, e.g., such as the extended region 544. Once the short CMP process has concluded, another thin layer of SOG material may be formed on the exposed surface of the resulting structure, which may again be followed by a short CMP process. These SOG deposition and CMP processes may be repeated any desired number of times such that a smooth, uniform layer of SOG material is ultimately formed on the surface of the resulting structure shown in FIG. 5R. In other words an upper surface of the SOG material 542 may be defined by one or more CMP processes. In some approaches, the one or more CMP processes may even expose an upper surface of the drain contact, e.g., as will soon become apparent.

Again, although only one transistor structure is shown as being formed in FIGS. 5A-5S, it should be noted that in other approaches, multiple transistor structures may be made simultaneously (e.g., at least somewhat in parallel). For instance, referring momentarily to FIG. 6, two different transistor structures 602, 604 are shown as being formed adjacent each other between a same pair of STI regions 606, e.g., as will be described in further detail below.

Referring now to FIG. 5S, the SOG material 542 has been removed in a controlled fashion (e.g., using one or more CMP processes) such that a smooth, uniform surface of the SOG layer 542 is created. Although not shown in the present embodiment, a source, a gate and/or a drain mask may be individually used, or used in combination to form vias which extend down to the underlying source contact tab 528, gate contact tab 540 and/or top of the substrate material 502' used to form the vertical annular cylindrical channel 508 structure. In some instances, the vias may be formed using an etching processes, however the specific type of etching process may vary depending on the desired approach.

The vias are also preferably filled with an electrically conductive and non-magnetic material (e.g., metal) in order to form electrically conductive connections which are electrically coupled to each of the source contact tab 528, gate contact tab 540 and/or top of the substrate material 502'. While in some approaches the conductive material used to fill each of the vias may be the same, in other approaches each of the vias may be filled with a different electrically conductive material, e.g., to facilitate different performance thereof. The electrically conductive material may be formed in the vias using a damascene process in some approaches. Moreover a CMP process may be used to define the upper surface of the electrically conductive materials once they have been filled into the vias.

As mentioned above, by filling the vias with an electrically conductive material (e.g., metal), an electrically conductive connection is formed between each of the contacts of the transistor structure with a respective voltage supply line. Thus, the electrically conductive material used to form these connections may effectively be considered an extension of the transistor contacts. Thus, although a majority of the formed vertical transistor structure is submerged in the SOG material 542, the transistor may be operated (e.g., activated) by applying voltages to each of the electrically conductive materials used to form these connections.

As a result, a transistor structure having a vertical, annular cylindrical channel along with a central vertical columnar gate contact may be formed, e.g., as represented by the dashed lines in FIG. 5S. Moreover, the resulting transistor structure is such that the channel and columnar gate contacts maintain the functionality of the resulting transistor structure. As alluded to above, this achieves a reduced overall footprint of the resulting transistor structure, which in turn reduces the minimum achievable memory cell size. Furthermore, by reducing the minimum achievable memory cell size, the approaches described herein are able to increase data storage density significantly in comparison what is conventionally achievable.

Referring still to FIG. 5S, a MTJ sensor stack 550 is formed above the vertical annular cylindrical channel 508 structure. A bottom layer of the MTJ sensor stack 550 is preferably electrically coupled to the upper surface of the substrate material 502' used to form the vertical annular cylindrical channel 508 structure. Moreover, a voltage source (e.g., drain line) may be coupled to a top surface of the MTJ sensor stack 550. Thus, a voltage may be applied to the MTJ sensor stack 550 to cause a current to pass therethrough when the transistor structure is activated, e.g., as would be appreciated by one skilled in the art after reading the present description.

As shown, the MTJ sensor stack 550 may include at least a reference layer 552, a tunnel barrier layer 554, and a free layer 556 included therein. According to an illustrative approach, each of the reference layer 552, the tunnel barrier layer 554, and the free layer 556 may be formed full film, after which a selective removal processes (e.g., etching process) may be used to define the resulting structure of the MTJ sensor stack 550 shown in FIG. 5S.

As described above, the magnetic orientation of the free layer 556 may be selectively set by applying a current to the MTJ sensor stack 550 in one of two directions through the layers thereof. By selectively setting the magnetic orientation of the free layer 556, a bit of data (logical "1" or logical "0") is written to the MTJ sensor stack 550 and stored therein. Moreover, the MTJ sensor stack 550 may include any of the approaches described herein depending on the desired approach, e.g., such as those described in correspondence with FIGS. 2-3 above.

It should be noted that, although not specified in a number of the steps included in FIGS. 5A-5S, the same material(s), removal processes, material processing procedures, etc. that are performed in the general recessed region 510 may be performed in the STI region 506 as well. Moreover, it should also be noted that additional layers may be present. Moreover, unless otherwise specified, the various layers formed in method 500 and/or other embodiments included herein may be formed using known processes which would be apparent to one skilled in the art after reading the present description.

Figure 6:
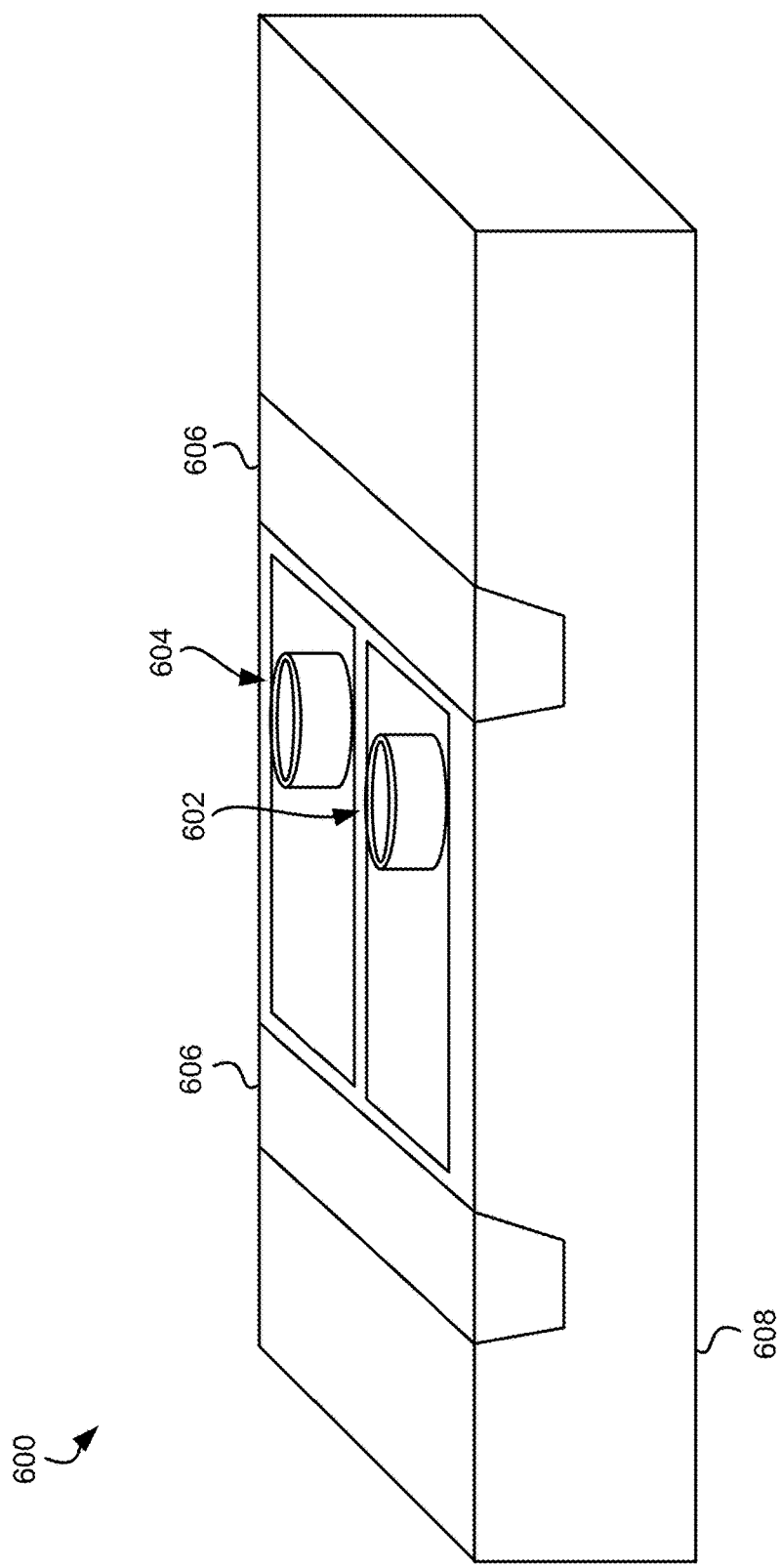
FIG. 6 is a fabrication configuration according to one embodiment.

Referring now to FIG. 6, a fabrication configuration 600 having two adjacent transistor structures 602, 604 is shown according to one embodiment. As an option, the present fabrication configuration 600 may be implemented in conjunction with features from any other embodiment listed herein, such as those described with reference to the other FIGS., such as FIGS. 5A-5S. However, such fabrication configuration 600 and others presented herein may be used in various applications and/or in permutations which may or may not be specifically described in the illustrative embodiments listed herein. Further, the fabrication configuration 600 presented herein may be used in any desired environment. Thus FIG. 6 (and the other FIGS.) may be deemed to include any possible permutation.

As mentioned above, the fabrication configuration 600 includes two adjacent transistor structures 602, 604 which are positioned between a pair of STI regions 606. It follows that in some approaches, multiple transistor structures may be formed simultaneously (e.g., at least somewhat in parallel) and adjacent one another from a single block of substrate material 608 which preferably includes silicon. Thus, various ones of the fabrication processes used to form the two adjacent transistor structures 602, 604 (e.g., see processes included in FIGS. 5A-5S above) may be performed on both structures at the same time (in parallel) from a single block of substrate material 608. However other ones of the processes used to form the two adjacent transistor structures 602, 604 may be performed on each of the structures individually. For example, one of the transistor structures 602 may be doped with n-type materials to form a resulting n-type transistor structure, while the other of the transistor structures 604 may be doped with p-type materials to form a resulting p-type transistor structure, e.g., as would be appreciated by one skilled in the art after reading the present description. Moreover, the block of substrate material used to form various components (submerged from view) included in the adjacent transistor structures 602, 604 is preferably silicon, but may include any desired material.

Figure 7:
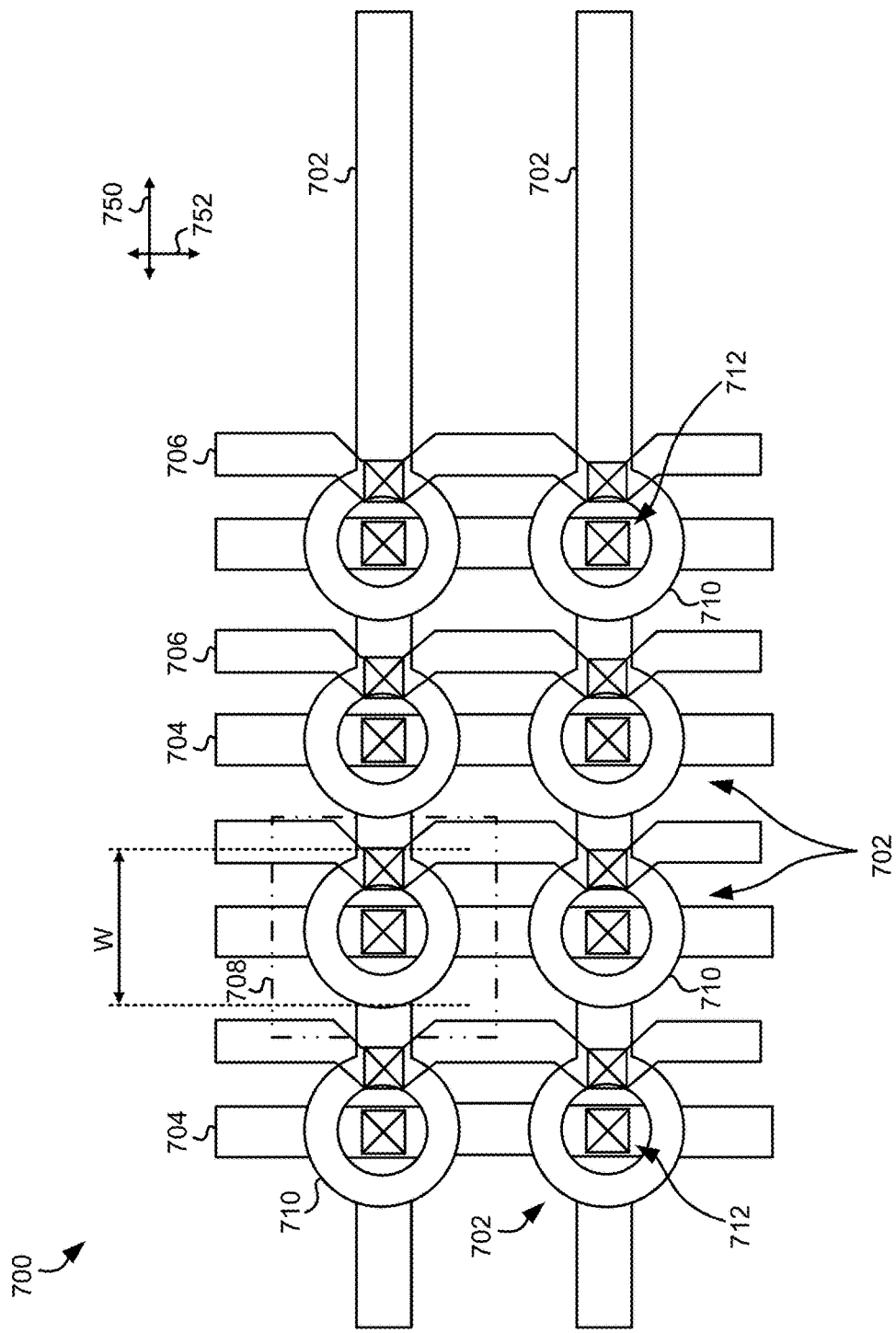
FIG. 7 is a partial representational layout view of a MRAM array according to one embodiment.

Referring now to FIG. 7, a MRAM array 700, is shown according to one embodiment. As an option, the present MRAM array 700 may be implemented in conjunction with features from any other embodiment listed herein, such as those described with reference to the other FIGS., such as FIGS. 2-6. However, such MRAM array 700 and others presented herein may be used in various applications and/or in permutations which may or may not be specifically described in the illustrative embodiments listed herein. Further, the MRAM array 700 presented herein may be used in any desired environment. Thus FIG. 7 (and the other FIGS.) may be deemed to include any possible permutation.

The MRAM array 700 includes a plurality of common word lines 702, a plurality of common source lines 704 and a plurality of common drain lines 706. As shown, each of the common word lines 702 extend in a direction 750 which is generally perpendicular to the direction 752 in which the common source lines 704 and common drain lines 706 extend. Moreover, an electrically conductive lead may extend into the page (represented by each "X") be used to couple each of the lines 702, 704, 706 to a respective one of the transistor contacts buried therebelow.

A transistor having a vertical annular cylindrical channel 710 as well as a vertical cylindrical pillar gate contact 712, e.g., according to any of the approaches described herein, may be positioned at each of the intersections of the common word lines 702, common source lines 704 and common drain lines 706. Accordingly, each of the vertical annular cylindrical channel transistors may have a central cylindrical pillar gate contact and gate contact tab (e.g., see 414, 408 respectively in FIG. 4A above) which is electrically coupled to one of the common word lines 702, a source contact tab (e.g., see 404 in FIGS. 4A-4B above) which is electrically coupled to one of the common source lines 704, and a drain contact (e.g., see upper surface of 410 in FIG. 4A above) which is electrically coupled to a MTJ sensor stack which is in turn coupled to one of the common drain lines 706, e.g., according to any of the approaches described here. Thus, by selectively applying voltages to the various common word lines 702, common source lines 704 and/or common drain lines 706, any one or more of the vertical annular cylindrical channel transistors coupled thereto may be activated and accordingly, data may be written to (and/or read from) a MTJ sensor stack coupled to the activated vertical annular cylindrical channel transistors.

Moreover, as mentioned above, the reduced footprint achieved by each of the vertical annular cylindrical channel transistors results in the data storage density of the overall MRAM array 700 to increase significantly. Looking to one specific cell 708 of the MRAM array 700, the cell 708 may have an effective width W of 4F, thereby resulting in the effective area of each of the cells in the MRAM array 700 4F×4F, or equivalently about $16F^2$. According to the present description, "F" represents the minimum feature size width defined by the lithography limits associated with the technology used to fabricate each of the cells. Thus, depending on the actual process(es) used to form the various cells 708, their effective size may vary depending on the value of F. This effective cell size of each of the cells 708 is significantly smaller than conventionally achievable which also results in the MRAM array 700 having performance characteristics which are improved significantly from conventional products, e.g., pertaining to processing speeds, storage density, efficiency, capability, etc.

With continued reference to FIG. 7, the various different memory cells 708 are arranged in a grid-like fashion. In other words, the different memory cells 708 are oriented in rows and columns which are substantially perpendicular to each other. This grid-like organization of the different memory cells 708 provides an efficient use of space and allows for the memory density of the resulting MRAM array 700 to be maximized. However, it should be noted that this grid-like arrangement of the memory cells 708 shown in FIG. 7 is in no way intended to limit the invention. Rather, the memory cells 708 and/or any of the lines 702, 704, 706 may be arranged differently depending on the desired approach.

The grid-like arrangement of the cells 708 (and transistors included therein) forms distinct columns and rows which extend throughout the MRAM array 700. Moreover, the columns and rows are interleaved such that each of the cells 708 are part of a defined row as well as a defined column. Thus, a specific one of the cells 708 may be individually identified given the row and column which it is located in. Although a specific number of columns and rows are illustrated in the present embodiment, any desired number of rows and/or columns may be implemented in order to scale the size of (e.g., the number of memory cells in) the MRAM array 700, and thus the storage capacity of the MRAM array 700. According to an example, hundreds, thousands, millions, etc. of cells 708 (each having a transistor and MTJ sensor stack pairing) may be organized in various rows and columns which extend perpendicularly relative to each other.

Furthermore, although not shown in the present embodiment, each of the common word lines 702, the common source lines 704 and the common drain lines 706 may be coupled to (e.g., in electrical communication with) a respective multiplexer. Moreover, each of the respective multiplexers may be coupled to a central controller. However, it should be noted that any one or more of these lines 702, 704, 706 may extend to any desired electrical component. The multiplexers may serve as an electrical circuit which is used to control a voltage that is applied to each of the respective lines 702, 704, 706, e.g., using logic gates for instance. Similarly, the controller may be configured to perform various processes which effect the voltages applied by the multiplexers to each of the respective lines 702, 704, 706, and in turn, the different terminals of the various transistors in each of the cells 708.

Moreover, by acting as a voltage generator, the multiplexers may be configured to counteract signal dampening experienced in the respective lines 702, 704, 706 coupled thereto. In other approaches, one or more of the multiplexers may serve as a sense amplifier in addition to a voltage generator. As a result, each of the multiplexers may be able to perform a read operation by receiving a signal from various ones of the transistors in the various cells 708, as well as perform write operations by applying a desired voltage to the respective lines 702, 704, 706 coupled thereto.

It follows that various ones of the approaches described herein are able to significantly increase the performance of transistor structures while also reducing the effective footprint thereof. As a result MRAM arrays implementing these transistor structures in combination with MTJ sensor stacks may desirably be able to achieve a resulting data storage density, performance efficiency, transistor reliability, etc. which are greater than what has been conventionally achievable. Moreover, specific characteristics of the transistor structures may be selectively tuned by adjusting the dimensions of vertical annular cylindrical structures used therein, materials included in the transistor structure, fabrication processes used when forming the transistor structures, etc.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems. One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product including a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method of forming a cylindrical vertical transistor, comprising:
    forming an annular cylindrical channel from a single block of electrically conductive material;
    forming an oxide layer over exposed surfaces of the annular cylindrical channel and exposed surfaces of the block of electrically conductive material;
    removing a portion of the oxide layer from an exterior base of the annular cylindrical channel, wherein removing the portion of the oxide layer forms a source contact recess which surrounds the base of the annular cylindrical channel;
    ion-implanting the exposed electrically conductive material substrate at a base of the source contact recess;
    depositing a silicide material in the source contact recess, thereby forming a source contact tab;
    depositing a gate mask over a majority of the oxide layer and the source contact tab;
    forming a recess by removing a portion of the oxide layer, a portion of the annular cylindrical channel, a portion of the annular oxide layer, and a portion of the cylindrical pillar gate contact;
    depositing an electrically insulating material over exposed surfaces of the oxide layer, the annular cylindrical channel, the annular oxide layer, and the cylindrical pillar gate contact in the formed recess;
removing the electrically insulating material from the exposed surfaces of the cylindrical pillar gate contact; and
depositing a third electrically conductive material in the recess and on the electrically insulating material,
wherein the third electrically conductive material deposited in the recess forms a gate contact tab.

2. The method as recited in claim 1, wherein the third electrically conductive material includes TaN.

3. The method as recited in claim 1, wherein the third electrically conductive material is non-magnetic.

4. The method as recited in claim 1, wherein the portion of the annular cylindrical channel, the portion of the annular oxide layer, and the portion of the cylindrical pillar gate contact are removed using an ion beam trench etching process.

5. The method as recited in claim 1, comprising:
forming a magnetic tunnel junction (MTJ) sensor stack above the annular cylindrical channel, such that a first end of the MTJ sensor stack is electrically coupled to an upper portion of the annular cylindrical channel.

6. A magnetic device, comprising:
a plurality of cylindrical vertical transistors formed using the method as recited in claim 5,
wherein a second end of the MTJ sensor stack in each of the cylindrical vertical transistors is coupled to a common drain line,
wherein the source contact tab in each of the cylindrical vertical transistors is coupled to a common source line,
wherein the gate contact tab in each of the cylindrical vertical transistors is coupled to a common word line.

* * * * *